United States Patent
Ding et al.

(10) Patent No.: US 12,328,882 B2
(45) Date of Patent: Jun. 10, 2025

(54) SEMICONDUCTOR DEVICE

(71) Applicant: Samsung Electronics Co., Ltd., Suwon-si (KR)

(72) Inventors: Shaofeng Ding, Suwon-si (KR); Jeong Hoon Ahn, Seongnam-si (KR); Yun Ki Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/611,843

(22) Filed: Mar. 21, 2024

(65) Prior Publication Data
US 2024/0234490 A1 Jul. 11, 2024

Related U.S. Application Data

(62) Division of application No. 17/472,771, filed on Sep. 13, 2021, now Pat. No. 11,961,882.

(30) Foreign Application Priority Data

Feb. 26, 2021 (KR) .......................... 10-2021-0026917

(51) Int. Cl.
*H01L 23/522* (2006.01)
*H01L 21/768* (2006.01)
(Continued)

(52) U.S. Cl.
CPC ....... *H10D 1/043* (2025.01); *H01L 21/76877* (2013.01); *H01L 21/76898* (2013.01);
(Continued)

(58) Field of Classification Search
CPC .......... H10D 1/00; H10D 1/68; H10D 1/043; H10D 1/716; H10D 12/00; H10D 12/01;
(Continued)

(56) References Cited

U.S. PATENT DOCUMENTS 8,492,241 B2 7/2013 Cheng et al.
8,642,456 B2 2/2014 Bartley et al.
(Continued)

FOREIGN PATENT DOCUMENTS

TW 201725738 A 7/2017

*Primary Examiner* — Chuong A Luu
(74) *Attorney, Agent, or Firm* — Muir Patent Law, PLLC

(57) ABSTRACT

A semiconductor device includes a semiconductor substrate including a connection region, a pair of epitaxial patterns provided at the semiconductor substrate, a capacitor disposed between the pair of epitaxial patterns, a middle connection layer on the capacitor, an interconnection layer on the middle connection layer, and a through-via provided under the interconnection layer and penetrating the connection region of the semiconductor substrate. The capacitor includes an upper portion of the semiconductor substrate between the pair of epitaxial patterns, a metal electrode on the upper portion of the semiconductor substrate, and a dielectric pattern disposed between the upper portion of the semiconductor substrate and the metal electrode. The through-via is connected to the capacitor through the interconnection layer and the middle connection layer.

5 Claims, 26 Drawing Sheets

(51) Int. Cl.
    *H01L 23/48*     (2006.01)
    *H10D 1/00*     (2025.01)
    *H10D 1/68*     (2025.01)

(52) U.S. Cl.
    CPC ........ *H01L 23/481* (2013.01); *H01L 23/5223* (2013.01); *H10D 1/716* (2025.01)

(58) Field of Classification Search
    CPC .... H10D 12/481; H10D 30/68; H10D 30/689; H10D 89/10; H10D 84/01; H10D 84/0186; H10D 84/813; H01L 21/768; H01L 21/76877; H01L 21/76898; H01L 23/48; H01L 23/481; H01L 23/64; H01L 23/522; H01L 23/528; H01L 23/642; H01L 23/5226; H01L 23/5223
    USPC .................................................. 257/582, 532
    See application file for complete search history.

(56) References Cited

U.S. PATENT DOCUMENTS

| | | |
|---|---|---|
| 8,785,289 B2 | 7/2014 | Kim et al. |
| 9,257,409 B2 | 2/2016 | Tzeng et al. |
| 9,691,684 B2 | 6/2017 | Park et al. |
| 9,786,581 B2 | 10/2017 | Kamgaing |
| 2001/0035548 A1 * | 11/2001 | Wahlstrom .......... G11C 11/4097 257/E21.396 |
| 2010/0301026 A1 | 12/2010 | Oishi et al. |
| 2013/0256834 A1 | 10/2013 | Tan et al. |
| 2018/0269276 A1 | 9/2018 | Lin et al. |
| 2020/0279803 A1 | 9/2020 | Wei et al. |

\* cited by examiner

SEMICONDUCTOR DEVICE

CROSS-REFERENCE TO RELATED APPLICATION

This application is a divisional of U.S. patent application Ser. No. 17/472,771 filed on Sep. 13, 2021, which claims priority under 35 U.S.C. § 119 to Korean Patent Application No. 10-2021-0026917, filed on Feb. 26, 2021, in the Korean Intellectual Property Office, the disclosure of which is hereby incorporated by reference in its entirety.

BACKGROUND

Embodiments of the inventive concepts relate to a semiconductor device and, more particularly, to a semiconductor device including a through-via.

A 3-dimensional (3D) package may be a single semiconductor package including a plurality of vertically stacked semiconductor chips. A 2.5D package may include a through-silicon via (TSV) applied to a passive silicon interposer instead of an active chip, and a chip bonded on a top surface of the interposer by a flip-chip bonding method. As the 3D package and the 2.5D package have been developed, TSVs penetrating a substrate, a die or an interposer to form vertical electrical connection have been recognized as important. As sizes and design rules of semiconductor devices are gradually reduced, it is desirable to develop a semiconductor device capable of increasing an integration density in an integration technique of a 3D package or 2.5D package using a TSV and of improving reliability of the TSV.

SUMMARY

Embodiments of the inventive concepts may provide a semiconductor device capable of improving reliability.

In an embodiment of the present inventive concept, a semiconductor device may include a semiconductor substrate including a connection region, a pair of first epitaxial patterns provided at the semiconductor substrate, a capacitor disposed between the pair of first epitaxial patterns, a middle connection layer on the capacitor, an interconnection layer on the middle connection layer, and a through-via provided under the interconnection layer and penetrating the connection region of the semiconductor substrate. The capacitor may include an upper portion of the semiconductor substrate between the pair of first epitaxial patterns, a metal electrode on the upper portion of the semiconductor substrate, and a dielectric pattern disposed between the upper portion of the semiconductor substrate and the metal electrode. The through-via may be connected to the capacitor through the interconnection layer and the middle connection layer.

In an embodiment of the present inventive concept, a semiconductor device may include a substrate including a logic cell region and a connection region, a capacitor provided at the connection region, a through-via disposed adjacent to the capacitor and penetrating the connection region, and a dummy transistor spaced apart from the through-via with the capacitor interposed therebetween. The capacitor may include a metal electrode on the substrate, and a dielectric pattern between the substrate and the metal electrode. The dummy transistor may include a gate electrode. The metal electrode may have a first width in a first direction parallel to a top surface of the substrate, and the gate electrode may have a second width in the first direction. The first width may be greater than the second width.

In an embodiment of the present inventive concept, a semiconductor device may include a silicon substrate including a logic cell region and a connection region, an active pattern provided at the connection region and protruding from a top surface of the connection region, a device isolation layer covering a sidewall of a lower portion of the active pattern and exposing an upper portion of the active pattern, a metal electrode overlapping the active pattern, a dielectric pattern between the metal electrode and the active pattern, an epitaxial pattern adjacent to a side of the metal electrode, a middle connection layer on the metal electrode and the epitaxial pattern, the middle connection layer comprising a ground contact electrically connected to the epitaxial pattern and an electrode contact electrically connected to the metal electrode, an interconnection layer on the middle connection layer, the interconnection layer comprising interconnection lines and vias electrically connecting the interconnection lines to the middle connection layer, and a through-via provided under the interconnection layer and penetrating the connection region. The vias may include a first via, a second via, and a third via. The first via may be connected to the through-via, the second via may be connected to the ground contact, and the third via may be connected to the electrode contact. The first via and the third via may be electrically connected with each other through a first interconnection line of the interconnection lines.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
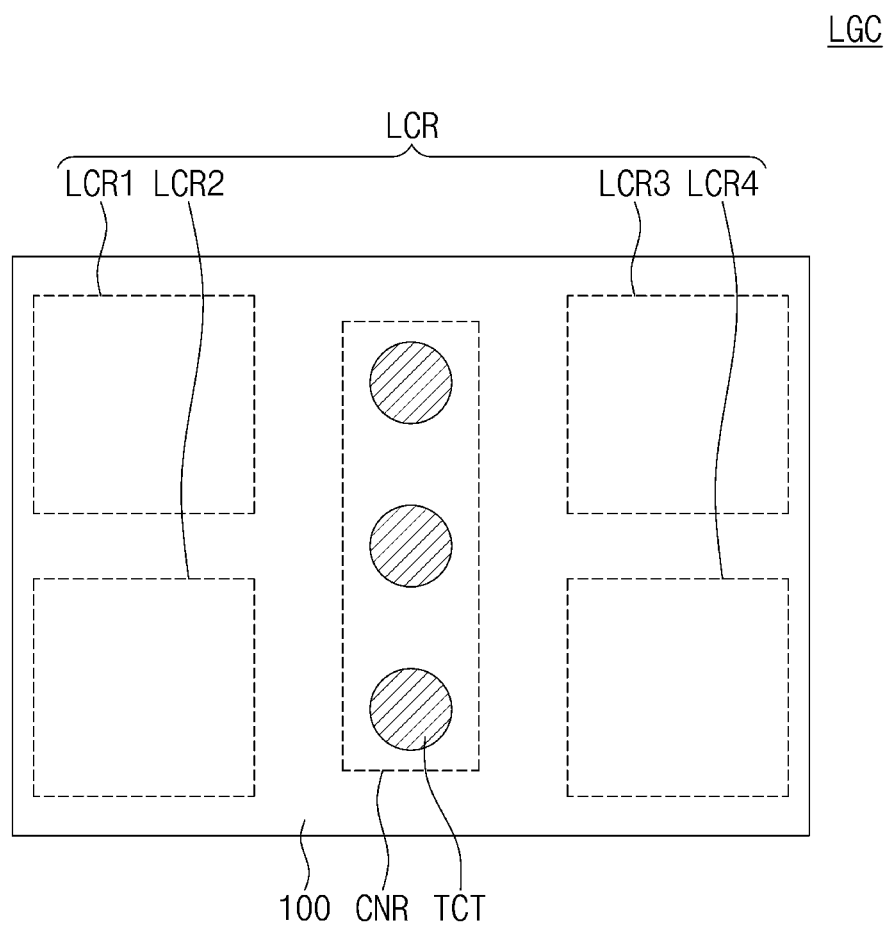
FIG. 1 is a plan view illustrating a semiconductor device according to some embodiments of the inventive concepts.

FIG. 1 is a plan view illustrating a semiconductor device according to some embodiments of the inventive concepts.

Referring to FIG. 1, a logic chip LGC may be provided. The logic chip LGC may include logic cell regions LCR on a substrate 100. For example, the logic cell regions LCR may include first to fourth logic cell regions LCR1 to LCR4. The first to fourth logic cell regions LCR1 to LCR4 may be two-dimensionally arranged on the substrate 100. Each of the logic cell regions LCR may be a region in which logic cells (i.e., standard cells) constituting a logic circuit are disposed. As used herein, the term "logic cell" may refer to a unit circuit configured to perform a single logical operation and be composed of a plurality of interconnected MOSFETs. Examples of logic cells include a NAND gate, a NOR gate, an inverter, and a latch. In addition, it will be apparent that the invention is not limited to one or a plurality of logic cells, but may be implemented in connection with one or more transistors, a portion of a transistor, an integrated circuit (e.g., comprising a plurality of interconnected logic cell), a semiconductor chip, a plurality of semiconductor chips (e.g., stacked in a package), etc.

The logic chip LGC may further include a connection region CNR between the logic cell regions LCR. The first to fourth logic cell regions LCR1 to LCR4 may be arranged around the connection region CNR. At least one through-via TCT may be provided in the connection region CNR.

Figure 2:
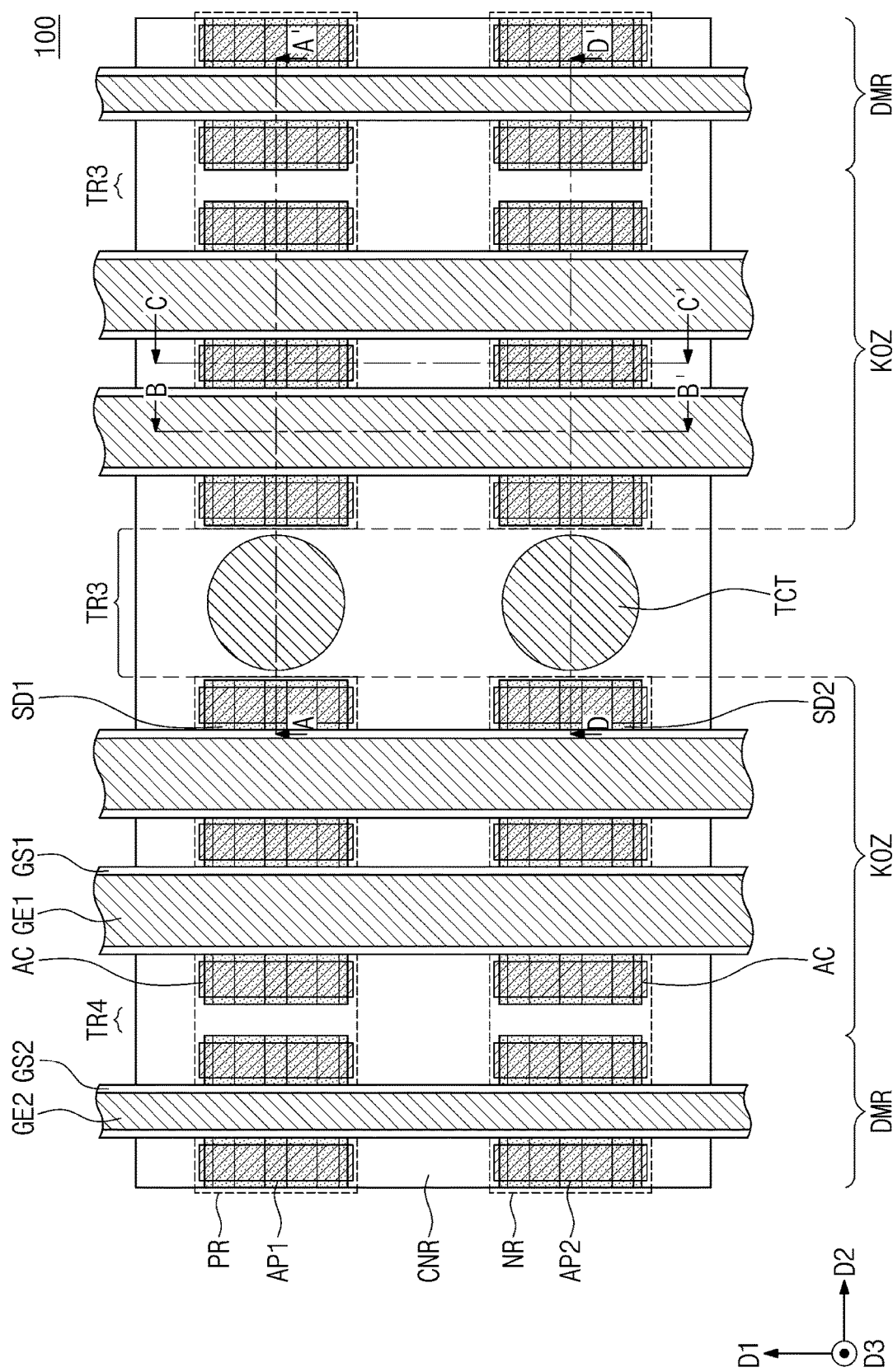
FIG. 2 is an enlarged plan view of a connection region of FIG. 1.

FIG. 2 is an enlarged plan view of a connection region of FIG. 1. FIGS. 3A, 3B, 3C and 3D are cross-sectional views taken along lines A-A', B-B', C-C' and D-D' of FIG. 2, respectively.

Hereinafter, the connection region CNR of the logic chip LGC will be described with reference to FIGS. 2 and 3A to 3D.

The substrate 100 may include a keep-out zone KOZ and a dummy cell region DMR. The keep-out zone KOZ may correspond to a region of the substrate in a range within a distance of about 10 μm from the through-via TCT. A coefficient of thermal expansion of a metal of the through-via TCT may be different from that of the substrate 100 (e.g., a silicon substrate). When a temperature is changed, the through-via TCT may apply thermal stress or physical stress to the substrate 100 adjacent thereto by a difference between the coefficients of thermal expansion. Due to the stress applied to the substrate 100, a crack may occur at the substrate 100 or the substrate 100 may be damaged. Thus, the keep-out zone KOZ may correspond to a region around the through-via TCT, where formation of elements (e.g., a transistor, etc.) is prohibited.

According to some embodiments of the inventive concepts, a decoupling capacitor CAP and epi patterns (i.e., epitaxial patterns) SD1 and SD2 may be provided in the keep-out zone KOZ, as described below. The dummy cell region DMR may be a region where dummy transistors are provided, as described below. As used herein, the term "dummy" is used to refer to a component that has the same or similar structure and shape as other components but does not have a substantial function and exists only as a pattern in the device.

The substrate 100 may include a first active region PR and a second active region NR. In some embodiments, the first active region PR may be a p-type metal oxide field effect transistor (PMOSFET) region where PMOSFETs are formed, and the second active region NR may be an n-type metal oxide field effect transistor (NMOSFET) region where NMOSFETs are formed. The substrate 100 may be a semiconductor substrate including silicon, germanium, or silicon-germanium or may be a compound semiconductor substrate. In some embodiments, the substrate 100 may be a silicon substrate.

The first active region PR and the second active region NR may be defined by a second trench TR2 formed in an upper portion of the substrate 100. The second trench TR2 may be disposed between the first active region PR and the second active region NR. The first active region PR and the second active region NR may be spaced apart from each other in a first direction D1 with the second trench TR2 interposed therebetween. Each of the first and second active regions PR and NR may extend in a second direction D2 intersecting the first direction D1.

First active patterns AP1 may be provided at the first active region PR, and second active patterns AP2 may be provided at the second active region NR. The first and second active patterns AP1 and AP2 may extend in parallel to each other in the second direction D2. The first and second active patterns AP1 and AP2 may be portions of the substrate 100, which vertically protrude. For example, the first and second active patterns AP1 and AP2 may protrude from a top surface of the substrate 100. In some embodiments, the first and second active patterns AP1 and AP2 may be part of the substrate 100 and may be formed by etching the substrate 100, and in this manner, protruding from the substrate 100 refers to protruding past a top surface of the substrate 100. In some embodiment, the first and second active patterns AP1 and AP2 may be formed by forming an epitaxial layer on the substrate 100 and then patterning the epitaxial layer. First trenches TR1 may be defined between the first active patterns AP1 adjacent to each other and between the second active patterns AP2 adjacent to each other. The first trench TR1 may be shallower than the second trench TR2.

Figure 3A:
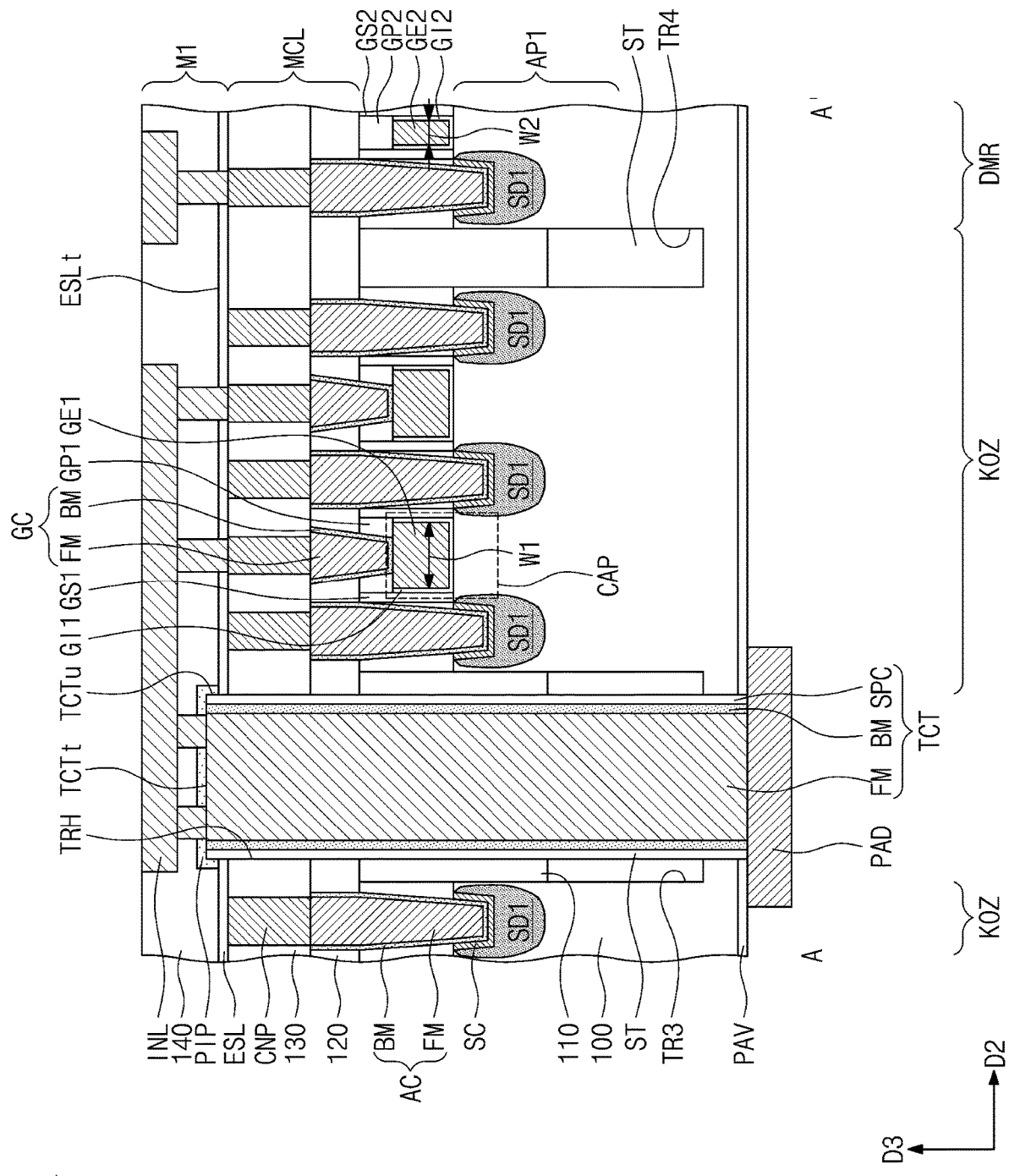
FIGS. 3A, 3B, 3C and 3D are cross-sectional views taken along lines A-A', B-B', C-C' and D-D' of FIG. 2, respectively.

Referring to FIGS. 2 and 3A, a third trench TR3 and a fourth trench TR4 may be formed in an upper portion of the substrate 100 to divide the first active pattern AP1 into segments in the second direction D2.

A device isolation layer ST may fill the first to fourth trenches TR1, TR2, TR3 and TR4. The device isolation layer ST may include or may be formed of a silicon oxide layer. Upper portions of the first and second active patterns AP1 and AP2 may vertically protrude above the device isolation layer ST (see FIG. 3B). Each of the upper portions of the first and second active patterns AP1 and AP2 may have a fin shape. The device isolation layer ST may not cover the upper portions of the first and second active patterns AP1 and AP2. The device isolation layer ST may cover sidewalls of lower portions of the first and second active patterns AP1 and AP2.

First epi patterns (i.e., first epitaxial patterns) SD1 may be provided in the upper portions of the first active patterns AP1. The first epi patterns SD1 may be dopant regions having a first conductivity type (e.g., a P-type). Second epi patterns (i.e., second epitaxial patterns) SD2 may be provided in the upper portions of the second active patterns AP2. The second epi patterns SD2 may be dopant regions having a second conductivity type (e.g., an N-type). In some embodiments, the first and second epi patterns SD1 and SD2 may be epitaxial patterns formed by a selective epitaxial growth (SEG) process. In some embodiments, the first and second epi patterns SD1 and SD2 may be patterns epitaxially grown at the active patterns AP1 and AP2 of the substrate 100 using an SEG process.

The first epi patterns SD1 may include a semiconductor material (e.g., SiGe) of which a lattice constant is greater than that of a semiconductor material of the substrate 100. Thus, the first epi patterns SD1 may provide compressive stress to the first active pattern AP1. For example, the second epi patterns SD2 may include the same semiconductor material (e.g., silicon) as the substrate 100.

At least one or more metal electrodes GE1 may intersect the first and second active patterns AP1 and AP2 and may extend in the first direction D1. For example, the metal electrodes GE1 may overlap the first and second active patterns AP1 and AP2. The metal electrodes GE1 may be provided on the keep-out zone KOZ. The metal electrodes GE1 may be arranged in the second direction D2. The metal electrode GE1 may be disposed between the first epi patterns SD1 when viewed in a plan view.

The metal electrodes GE1 may surround a top surface and opposite sidewalls of each of the first and second active patterns AP1 and AP2 protruding from the device isolation layer ST. For example, the metal electrodes GE1 may extend along the top surface and opposite sidewalls of each of the first and second active patterns AP1 and AP2.

Referring again to FIGS. 2 and 3A to 3D, a pair of electrode spacers GS1 may be disposed on opposite sidewalls of each of the metal electrodes GE1, respectively. The electrode spacers GS1 may extend along the metal electrodes GE1 in the first direction D1. Top surfaces of the electrode spacers GS1 may be higher than top surfaces of the metal electrodes GE1. The top surfaces of the electrode spacers GS1 may be coplanar with a top surface of a first interlayer insulating layer 110 to be described later. For example, the electrode spacers GS1 may include or may be formed of at least one of SiCN, SiCON, and SiN. In certain embodiments, each of the electrode spacers GS1 may have a multi-layered structure formed of at least two of SiCN, SiCON, and SiN.

A first capping pattern GP1 may be provided on each of the metal electrodes GE1. The first capping pattern GP1 may extend along the metal electrode GE1 in the first direction D1. The first capping pattern GP1 may include or may be formed of a material having etch selectivity with respect to first and second interlayer insulating layers 110 and 120 to be described later. For example, the first capping patterns GP1 may include or may be formed of at least one of SiON, SiCN, SiCON, and SiN.

A first dielectric pattern GI1 may be disposed between the metal electrode GE1 and the first active pattern AP1 and between the metal electrode GE1 and the second active pattern AP2. The first dielectric pattern GI1 may extend along a bottom surface of the metal electrode GE1 disposed thereon. The first dielectric pattern GI1 may cover a top surface of the device isolation layer ST under the metal electrode GE1 (see FIG. 3B).

In some embodiments, the first dielectric pattern GI1 may include or may be formed of a high-k dielectric material of which a dielectric constant is higher than that of silicon oxide. For example, the high-k dielectric material may include at least one of hafnium oxide, hafnium-silicon oxide, hafnium-zirconium oxide, hafnium-tantalum oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, and lead-zinc niobate.

The metal electrode GE1 may include a first metal pattern and a second metal pattern on the first metal pattern.

The first metal pattern may include a work function metal for adjusting a threshold voltage of a transistor. A desired threshold voltage may be obtained by adjusting a thickness and a composition of the first metal pattern. The first metal pattern may include or may be formed of a metal nitride layer. For example, the first metal pattern may include nitrogen (N) and at least one metal selected from a group consisting of titanium (Ti), tantalum (Ta), aluminum (Al), tungsten (W), and molybdenum (Mo). The first metal pattern may further include carbon (C). In some embodiments, the first metal pattern may include a plurality of stacked work function metal layers.

The second metal pattern may include or may be formed of metal having a resistance lower than that of the first metal pattern. For example, the second metal pattern may include at least one metal selected from a group consisting of tungsten (W), aluminum (Al), titanium (Ti), and tantalum (Ta).

At least one or more gate electrodes GE2 may intersect the first and second active patterns AP1 and AP2 and may extend in the first direction D1. For example, the gate electrodes GE2 may overlap the first and second active patterns AP1 and AP2. The gate electrodes GE2 may be provided on the dummy cell region DMR. A pair of gate spacers GS2 may be disposed on opposite sidewalls of each of the gate electrodes GE2, respectively. A second capping pattern GP2 may be provided on each of the gate electrodes GE2. A second dielectric pattern GI2 may be disposed between the gate electrode GE2 and the first active pattern AP1 and between the gate electrode GE2 and the second active pattern AP2. The gate electrode GE2, the gate spacers GS2, the second capping pattern GP2 and the second dielectric pattern GI2 may correspond to the metal electrode GE1, the electrode spacers GS1, the first capping pattern GP1 and the first dielectric pattern GI1, respectively. The gate electrode GE2, the gate spacers GS2, the second capping pattern GP2 and the second dielectric pattern GI2 may include or may be formed of the same materials as the metal electrode GE1, the electrode spacers GS1, the first capping pattern GP1 and the first dielectric pattern GI1, respectively.

According to some embodiments of the inventive concepts, the metal electrode GE1 may have a first width W1 in the second direction D2. The gate electrode GE2 may have a second width W2 in the second direction D2. The first width W1 may be greater than the second width W2. For example, the first width W1 may range from 2 times to 10 times the second width W2. The metal electrode GE1 may function as an electrode of a decoupling capacitor CAP as described below, and an area of the metal electrode GE1 may be increased to increase a capacitance of the decoupling capacitor CAP.

The gate electrode GE2, the second dielectric pattern GI2 and a pair of the epi patterns SD1 or SD2 at opposite sides of the gate electrode GE2 on the dummy cell region DMR may constitute a dummy transistor. Epi patterns SD1 and SD2 on the logic cell region LCR may function as source/drain patterns.

A first interlayer insulating layer 110 may be provided on the substrate 100. The first interlayer insulating layer 110 may cover the electrode spacers GS1, the gate spacers GS2, and the first and second epi patterns SD1 and SD2. A top surface of the first interlayer insulating layer 110 may be substantially coplanar with top surfaces of the first and second capping patterns GP1 and GP2 and top surfaces of the electrode and gate spacers GS1 and GS2. A second interlayer insulating layer 120 may be provided on the first interlayer insulating layer 110 to cover the first capping patterns GP1 and the second capping patterns GP2. A third interlayer insulating layer 130 may be provided on the second interlayer insulating layer 120. A fourth interlayer insulating layer 140 may be provided on the third interlayer insulating layer 130. For example, each of the first to fourth interlayer insulating layers 110 to 140 may include or may be formed of a silicon oxide layer. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Ground contacts AC may penetrate the second and first interlayer insulating layers 120 and 110 so as to be electrically connected to the first and second epi patterns SD1 and SD2. Each of the ground contacts AC may be provided between a pair of the metal electrodes GE1. The ground contacts AC may be used to apply a ground voltage to the first and second epi patterns SD1 and SD2.

Silicide patterns SC may be disposed between the ground contact AC and the first epi pattern SD1 and between the ground contact AC and the second epi pattern SD2, respectively. The ground contact AC may be electrically connected to the epi pattern SD1 or SD2 through the silicide pattern SC. The silicide pattern SC may include or may be formed of a metal silicide. For example, the silicide pattern SC may include or may be formed of at least one of, for example, titanium silicide, tantalum silicide, tungsten silicide, nickel silicide, and cobalt silicide.

The ground contact AC may include or may be formed of a conductive pattern FM and a barrier pattern BM surrounding the conductive pattern FM. For example, the conductive pattern FM may include or may be formed of at least one metal of aluminum, copper, tungsten, molybdenum, and cobalt. The barrier pattern BM may cover a bottom surface and sidewalls of the conductive pattern FM. The barrier pattern BM may include or may be formed of a metal nitride layer, or a metal layer/a metal nitride layer. The metal layer may include or may be formed of at least one of titanium, tantalum, tungsten, nickel, cobalt, and platinum. The metal nitride layer may include or may be formed of at least one of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

At least one electrode contact GC may penetrate the second interlayer insulating layer 120 and the first capping pattern GP1 so as to be electrically connected to the metal electrode GE1. The electrode contact GC may be disposed between the first active region PR and the second active region NR when viewed in a plan view.

The electrode contact GC may include or may be formed of a conductive pattern FM and a barrier pattern BM surrounding the conductive pattern FM. The conductive pattern FM and the barrier pattern BM of the electrode contact GC may include or may be formed of the same materials as the conductive pattern FM and the barrier pattern BM of the ground contact AC, respectively.

Figure 3B:
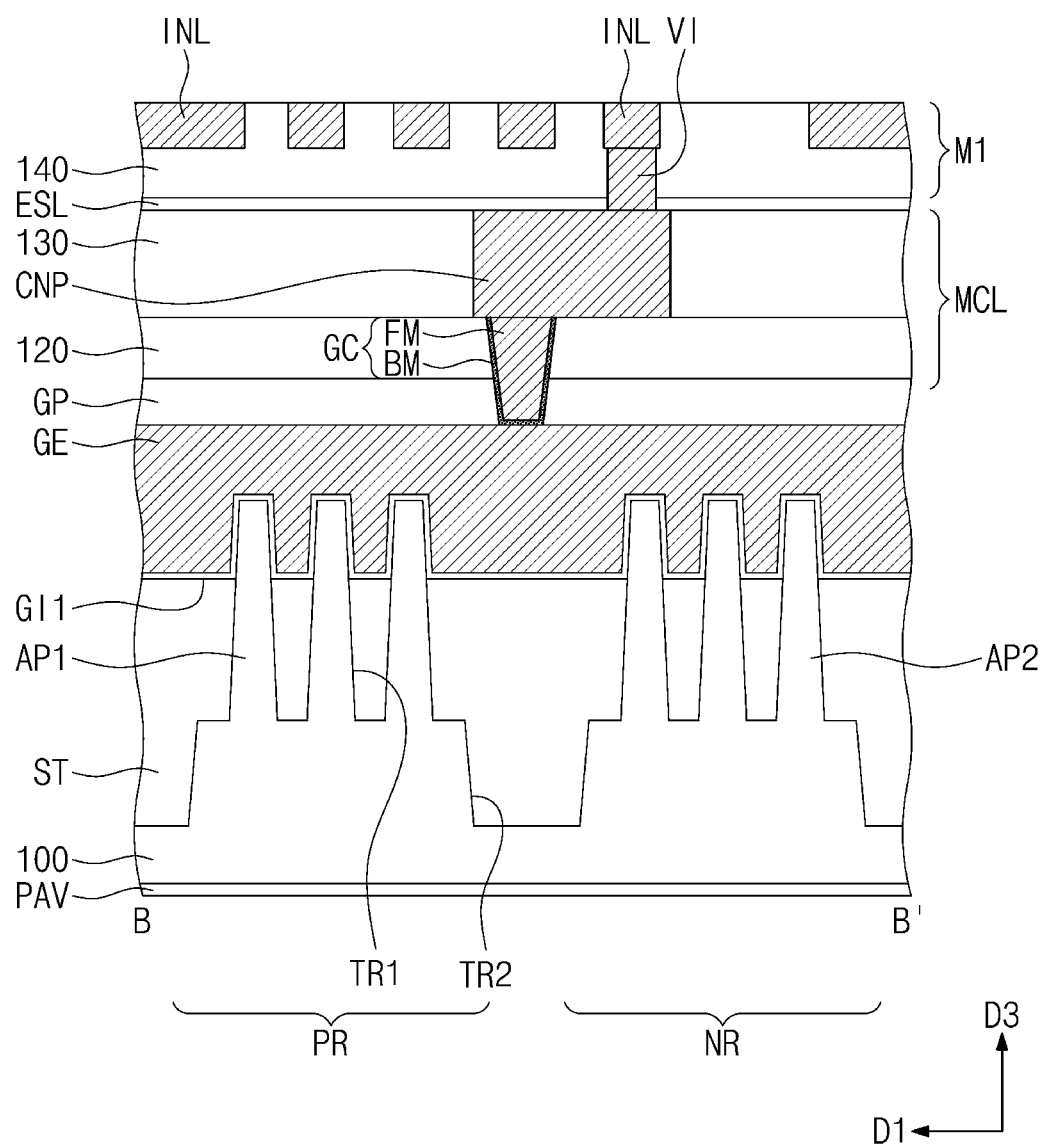
Figure 3C:
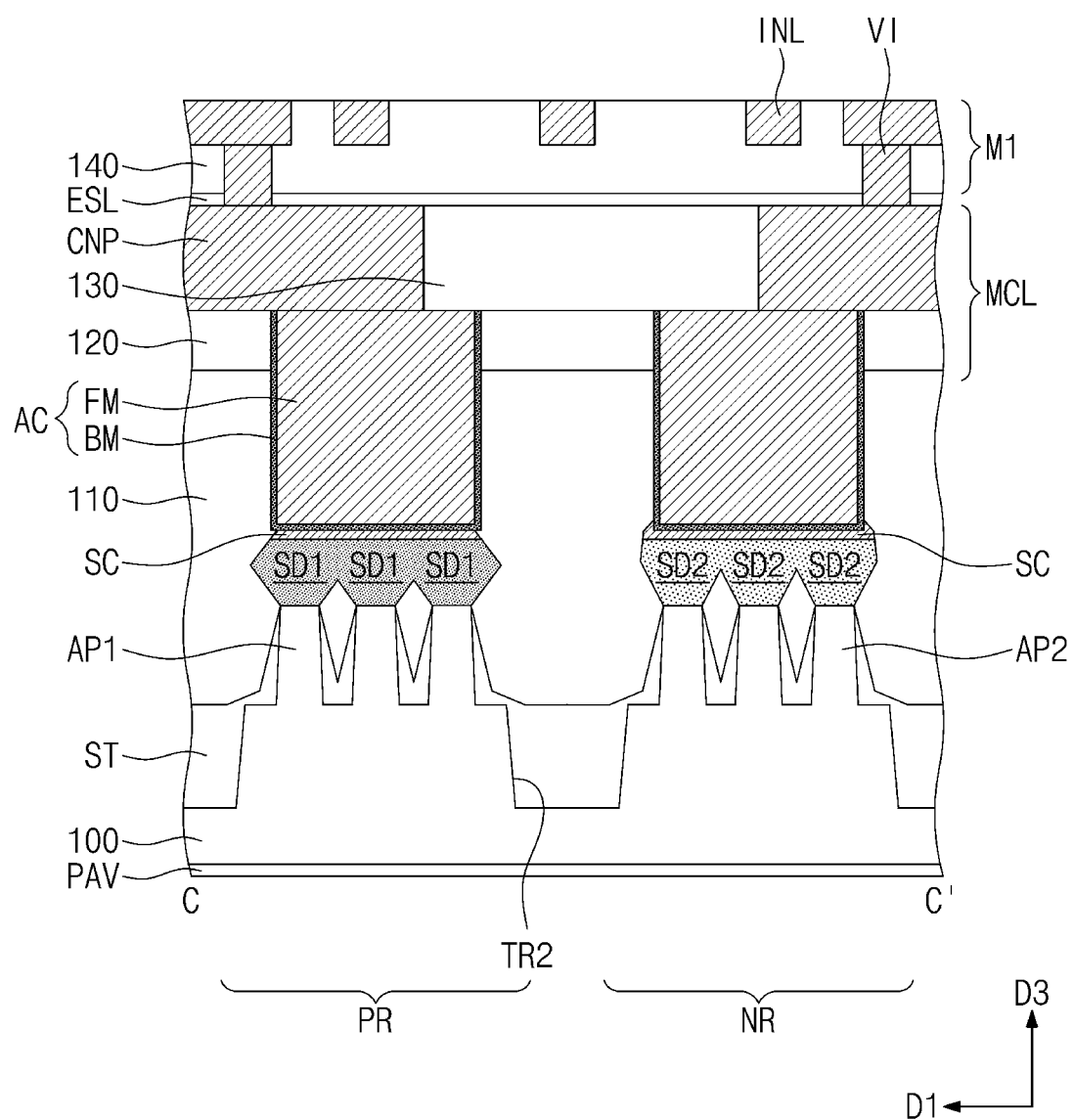
Figure 3D:
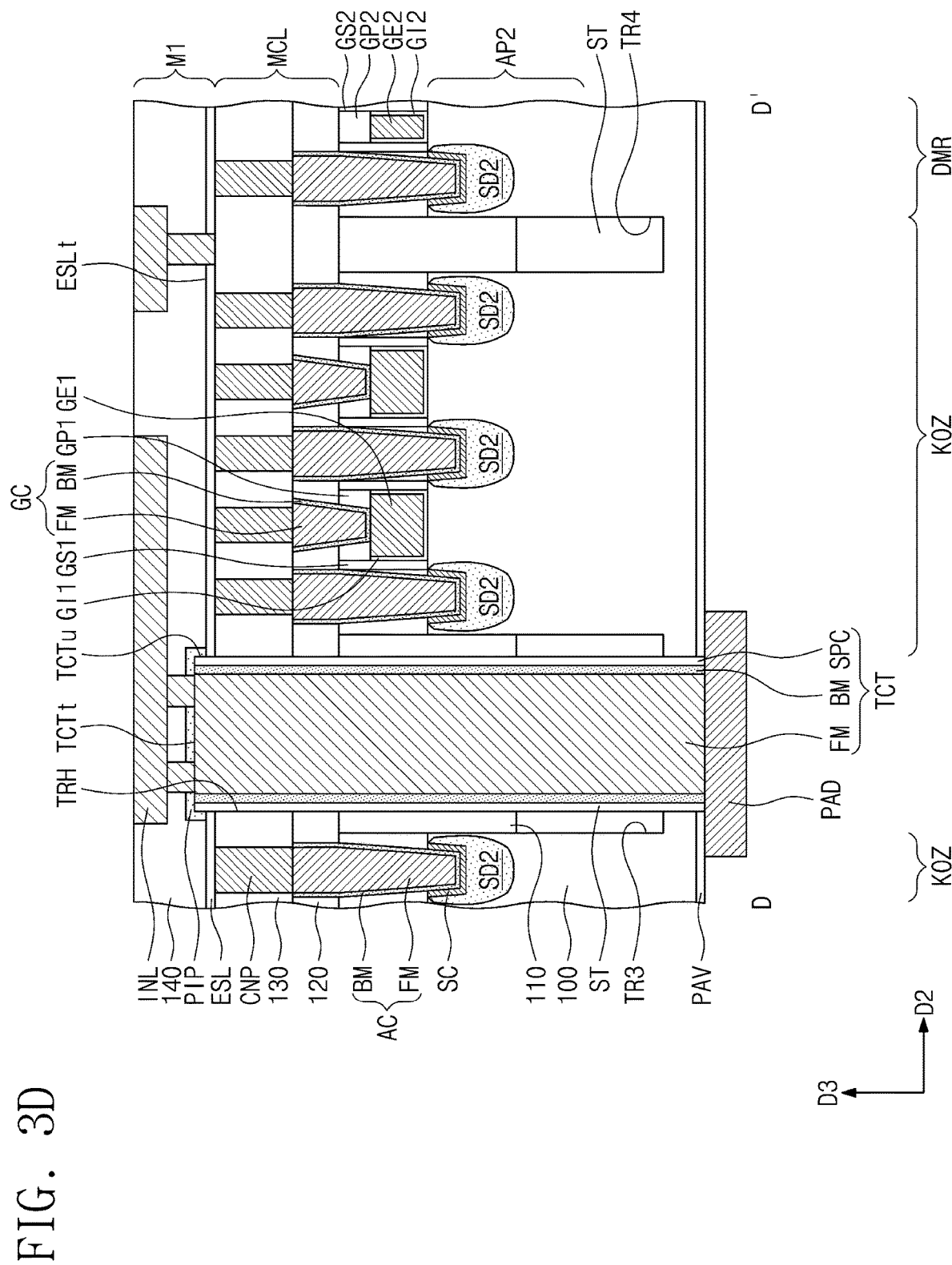

Connection patterns CNP may be provided in the third interlayer insulating layer 130. The connection patterns CNP may be provided on the ground contacts AC and the electrode contact GC, respectively. Some of the connection patterns CNP may connect the ground contacts AC to the ground. Some of the connection patterns CNP may connect the electrode contacts GC to an interconnection layer to be described later. The connection patterns CNP may be provided between the ground contacts AC and the interconnection layer, and between the electrode contacts GC and the interconnection layer to increase or improve a degree of freedom of routing. For example, as illustrated in FIG. 3B, the connection pattern CNP on the electrode contact GC may connect the electrode contact GC to an interconnection line INL horizontally offset from the electrode contact GC. In certain embodiments, the connection patterns CNP may be omitted.

The ground and electrode contacts AC and GC in the second interlayer insulating layer 120 and the connection patterns CNP in the third interlayer insulating layer 130 may constitute a middle connection layer MCL. The middle connection layer MCL may electrically connect an interconnection layer M1 to be described later, to transistors on the substrate 100. The middle connection layer MCL may be formed by a middle-of-line (MOL) process to be described later.

An etch stop layer ESL may be disposed between the third interlayer insulating layer 130 and the fourth interlayer insulating layer 140. For example, the etch stop layer ESL may include or may be formed of a silicon oxide layer.

An interconnection layer M1 may be provided in the fourth interlayer insulating layer 140. The interconnection layer M1 may include interconnection lines INL and vias VI. Each of the vias VI may be provided under a corresponding one of the interconnection lines INL. For example, the interconnection lines INL may extend in the second direction D2 in parallel to each other. The interconnection lines INL may be arranged in the first direction D1 at a certain pitch. Each of the vias VI may be disposed between a corresponding one of the interconnection lines INL and a corresponding one of the connection patterns CNP to electrically connect the corresponding interconnection line INL to the corresponding connection pattern CNP. Each of the vias VI may penetrate the etch stop layer ESL so as to be in contact with a top surface of the corresponding connection pattern CNP. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The interconnection lines INL and the vias VI may include or may be formed of the same conductive material. For example, the interconnection lines INL and the vias VI may include or may be formed of at least one metal material selected from a group consisting of aluminum, copper, tungsten, molybdenum, ruthenium, and cobalt. Even though not shown in the drawings, additional interconnection layers (e.g., a second interconnection layer, a third interconnection layer, a fourth interconnection layer, etc.) may be stacked on the fourth interlayer insulating layer 140.

Referring to FIG. 2, the through-via TCT may be spaced apart from the dummy cell region DMR by a predetermined distance. The through-via TCT may be provided in the third trench TR3. The through-via TCT may penetrate the device isolation layer ST filling the third trench TR3 and the substrate 100 disposed under the device isolation layer ST. The through-via TCT may be provided under the interconnection layer M1. The through-via TCT may vertically extend from a lower portion of the fourth interlayer insulating layer 140 to a bottom surface of the substrate 100.

A passivation layer PAV may be provided on the bottom surface of the substrate 100. The passivation layer PAV may surround an exposed lower portion of the through-via TCT. A connection pad PAD may be provided on the exposed lower portion of the through-via TCT.

An upper portion of the through-via TCT may penetrate the etch stop layer ESL to protrude above the etch stop layer ESL. A protective insulating pattern PIP may be provided to cover the protruding upper portion of the through-via TCT. For example, the protective insulating pattern PIP may cover a top surface TCTt of the through-via TCT and an upper sidewall TCTu of the through-via TCT. The protective insulating pattern PIP may include or may be formed of at least one of SiN, SiCN, and SiON.

The top surface TCTt of the through-via TCT may be higher than a top surface ESLt of the etch stop layer ESL. The top surface TCTt of the through-via TCT may be located at a level between a bottom surface and a top surface of the fourth interlayer insulating layer 140. The protective insulating pattern PIP may partially cover the top surface ESLt of the etch stop layer ESL adjacent to the through-via TCT. The protective insulating pattern PIP may extend from the top surface ESLt of the etch stop layer ESL onto the top surface TCTt of the through-via TCT.

At least one of the vias VI of the interconnection layer M1 may penetrate the protective insulating pattern PIP so as to be in contact with the top surface TCTt of the through-via TCT. For example, at least one of the interconnection lines INL of the interconnection layer M1 may be electrically connected to the through-via TCT through the at least one via VI.

The through-via TCT may include a conductive pattern FM, a barrier pattern BM surrounding the conductive pattern FM, and an insulating spacer SPC. The conductive pattern FM of the through-via TCT may have a vertically extending pillar shape. The barrier pattern BM of the through-via TCT may surround an outer sidewall of the conductive pattern FM of the through-via TCT. The barrier pattern BM of the through-via TCT may expose a top surface and a bottom surface of the conductive pattern FM of the through-via TCT. The insulating spacer SPC may surround an outer sidewall of the barrier pattern BM of the through-via TCT.

For example, the conductive pattern FM of the through-via TCT may include or may be formed of at least one metal of aluminum, copper, tungsten, molybdenum, and cobalt. The barrier pattern BM of the through-via TCT may include or may be formed of a metal nitride layer, or a metal layer/a metal nitride layer.

According to some embodiments of the inventive concepts, at least one decoupling capacitor CAP and the epi patterns SD1 or SD2 provided at opposite sides of the decoupling capacitor CAP may be provided in the keep-out zone KOZ. The decoupling capacitor CAP may be a metal-insulator-silicon (MIS) capacitor. The metal electrode GE1, an upper portion of the substrate 100 between a pair of the epi patterns SD1 or SD2 and the first dielectric pattern GI1 may function as a first electrode, a second electrode and a dielectric layer between the first and second electrodes in the decoupling capacitor CAP, respectively.

The decoupling capacitor CAP may be connected to the through-via TCT through the middle connection layer MCL and the interconnection layer M1. For example, a ground voltage may be applied to the epi patterns SD1 or SD2 through the ground contacts AC of the middle connection layer MCL. A VDD voltage may be applied to the metal electrode GE1 through the electrode contact GC of the middle connection layer MCL. The electrode contact GC may be connected to the through-via TCT through the connection pattern CNP of the middle connection layer MCL and the vias VI and the interconnection line INL of the interconnection layer M1.

Except for a thickness and/or the width of the metal electrode GE1, the decoupling capacitor CAP and the epi patterns SD1 and SD2 of the keep-out zone KOZ may have substantially the same structure as the dummy cell region DMR. The logic cell region LCR may have substantially the same structure as the dummy cell region DMR.

According to the embodiments of the inventive concepts, the decoupling capacitor CAP may be formed in the keep-out zone KOZ which may be filled with a device isolation layer, and thus a space may be efficiently used to increase an integration density. The decoupling capacitor CAP may be electrically connected to the through-via TCT, thereby reducing an IR drop caused by a resistance of the through-via TCT. The decoupling capacitor CAP of the keep-out zone KOZ may have a similar shape to the dummy transistor of the dummy cell region DMR and a cell transistor of the logic cell region LCR, and may be formed by the same processes as the dummy and cell transistors. Thus, the decoupling capacitor CAP may be formed without performing an additional process.

Figure 9A:
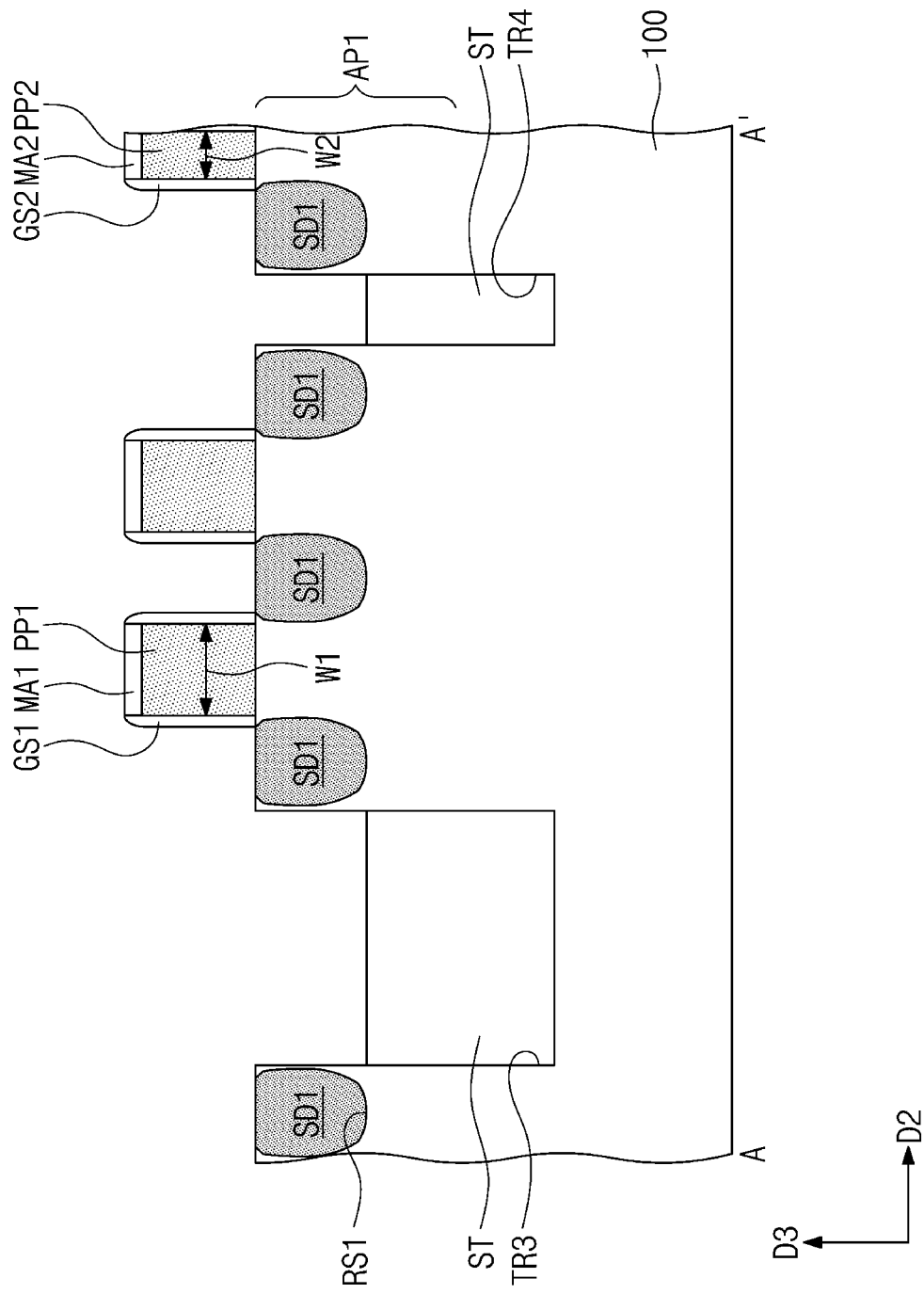
Figure 9B:
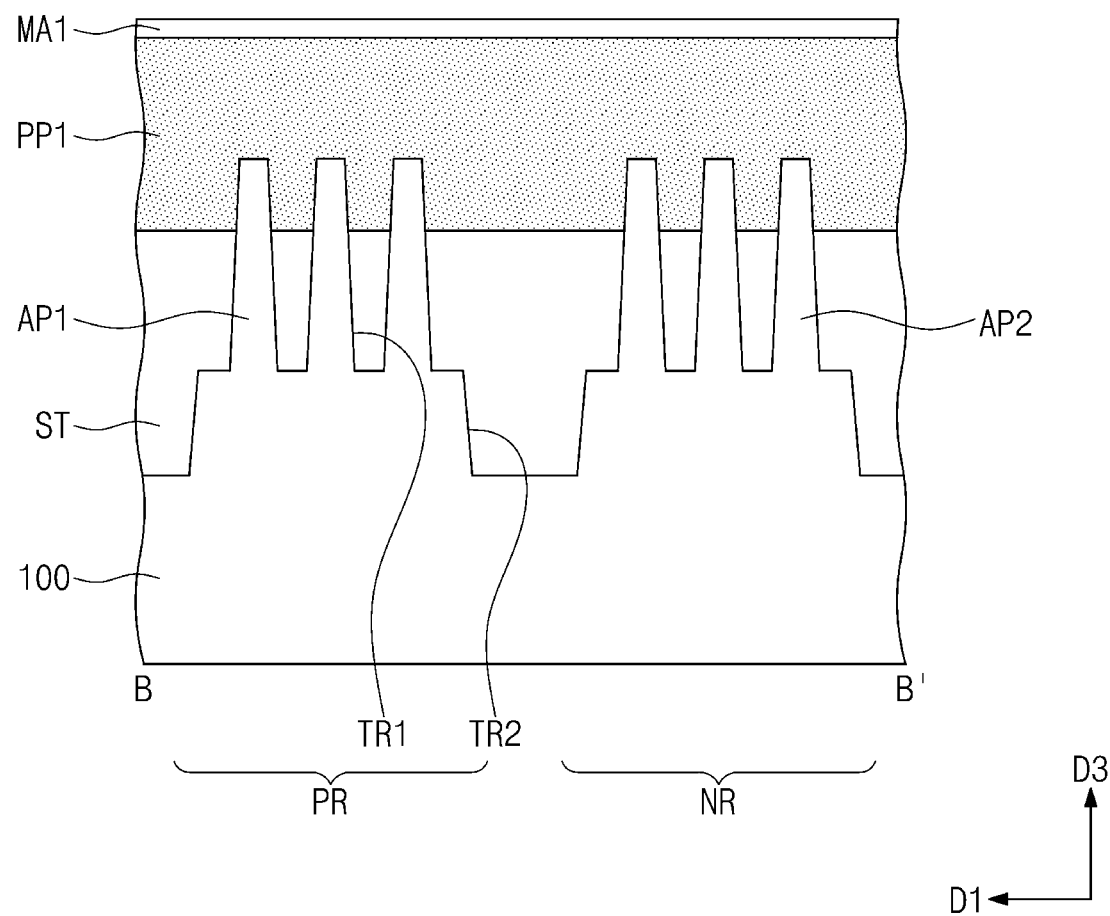
Figure 9C:
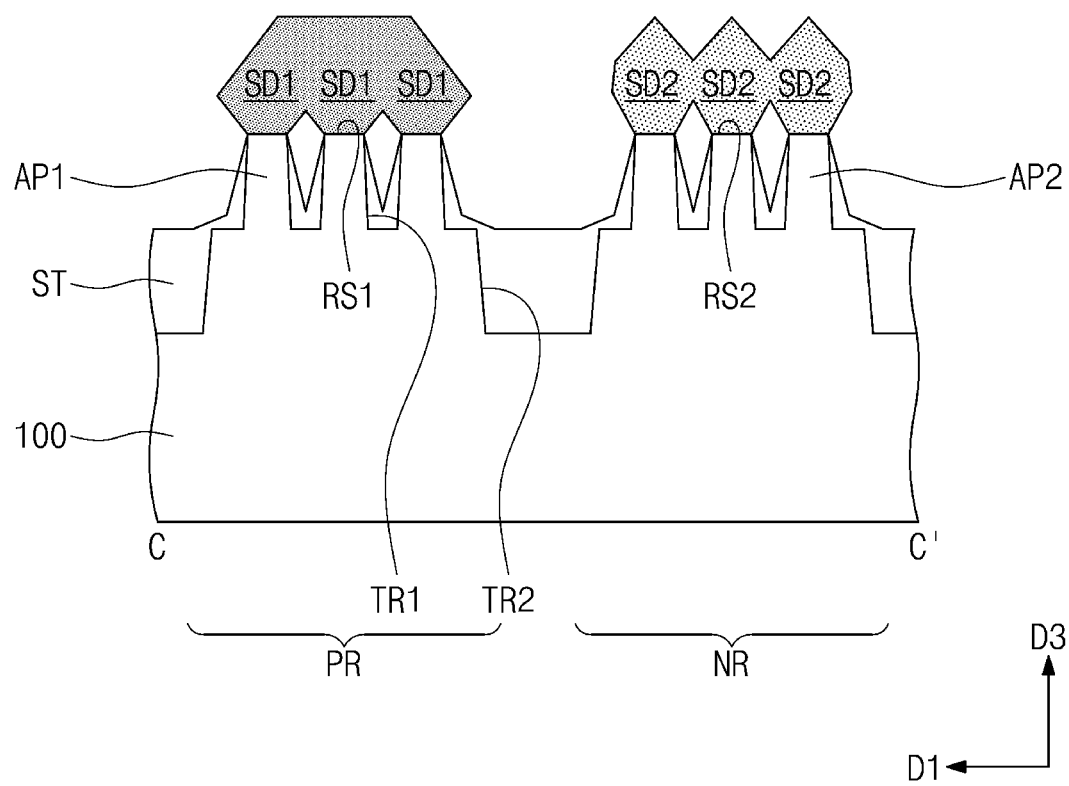
FIGS. 9C and 11C are cross-sectional views taken along lines C-C' of FIGS. 8 and 10, respectively.
Figure 10:
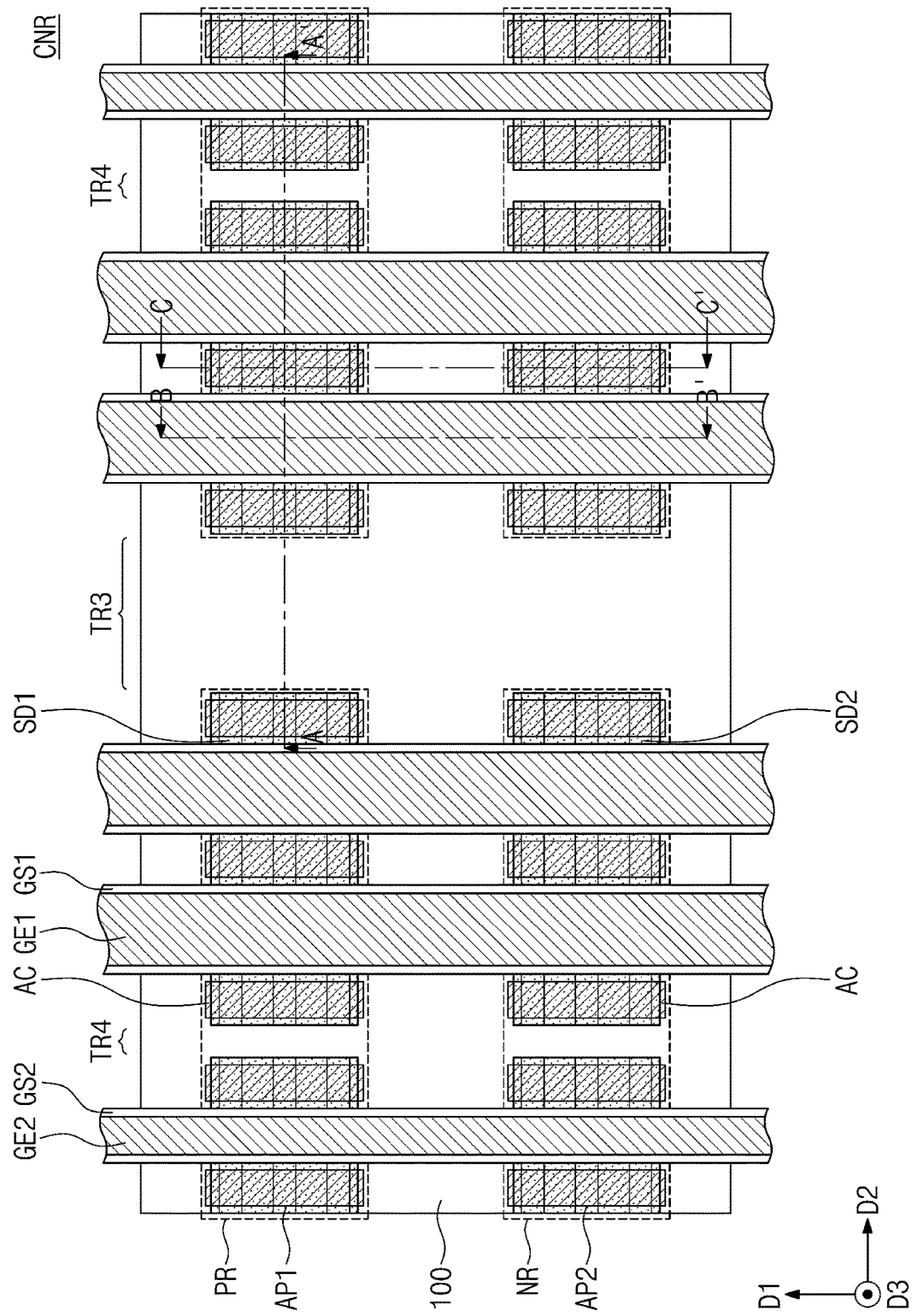
Figure 11A:
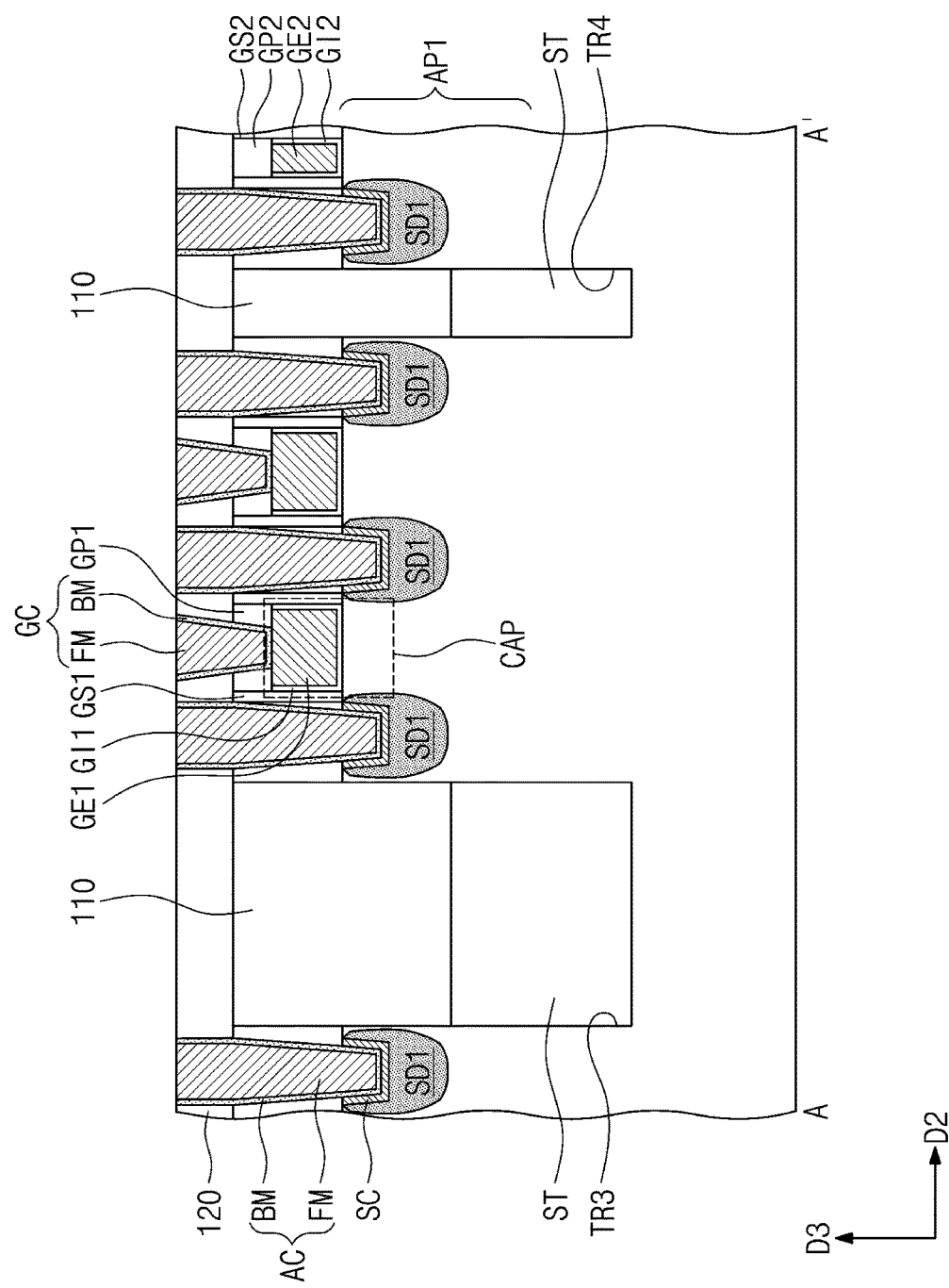
Figure 11B:
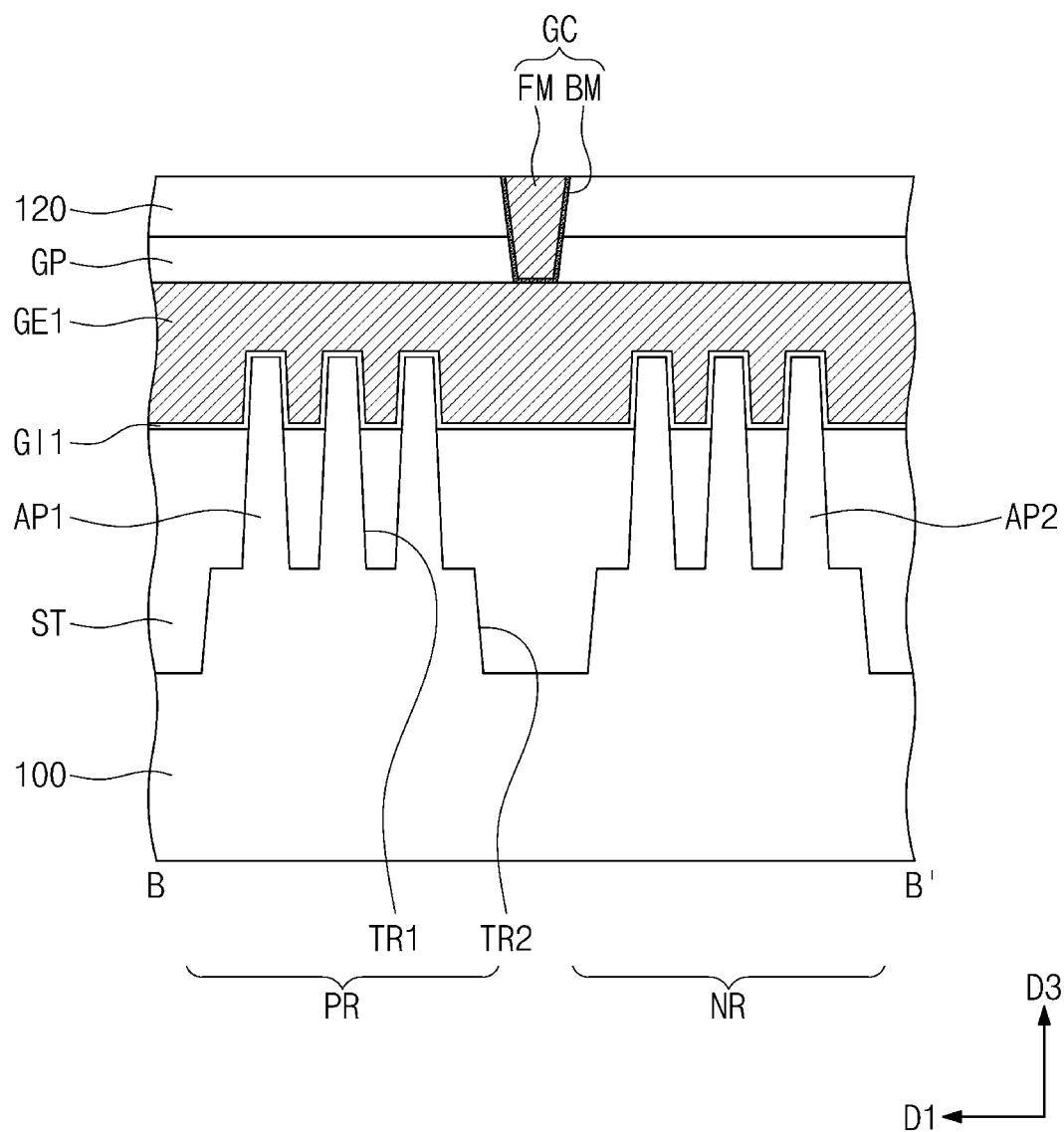
Figure 11C:
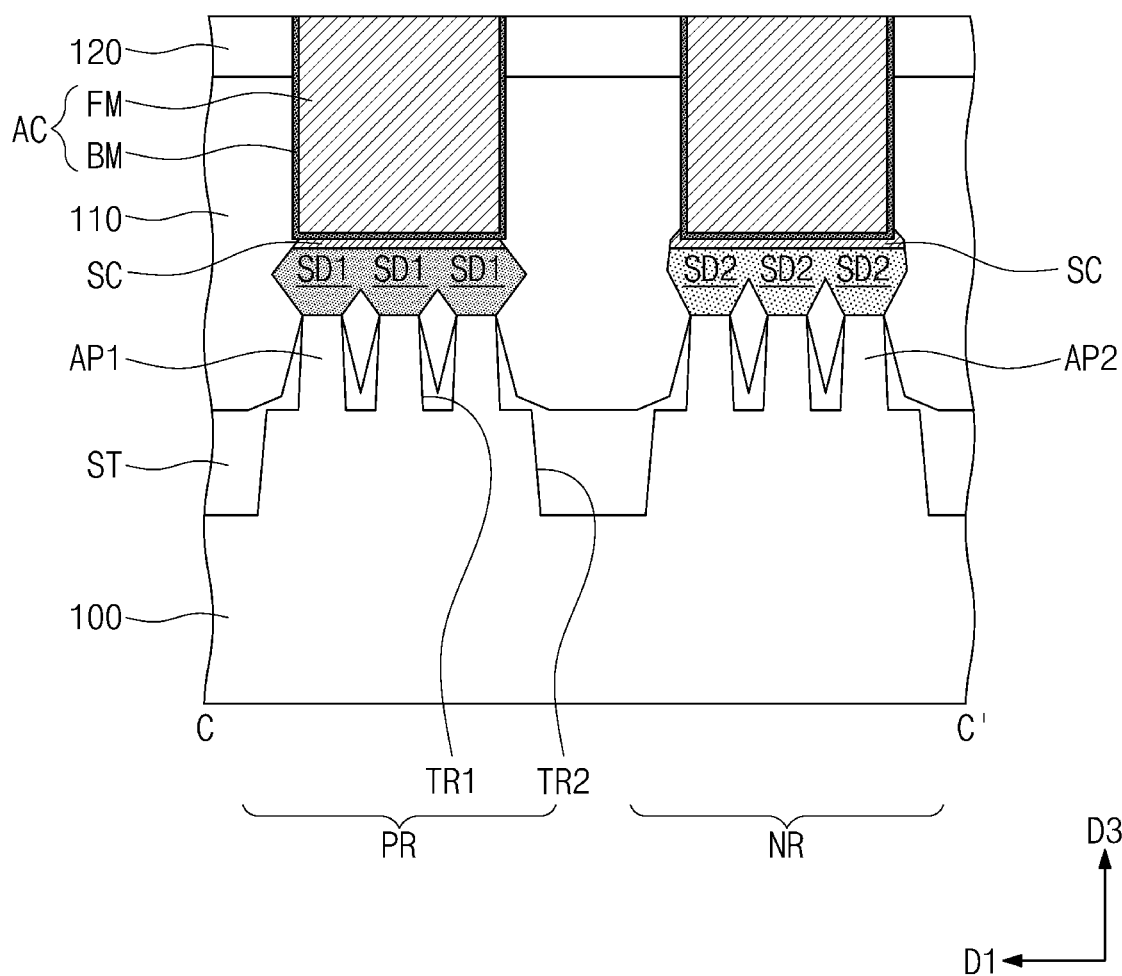

FIGS. 4, 6, 8 and 10 are plan views illustrating a method of manufacturing a semiconductor device according to some embodiments of the inventive concepts. FIGS. 5A, 7A, 9A and 11A are cross-sectional views taken along lines A-A' of FIGS. 4, 6, 8 and 10, respectively. FIGS. 5B, 7B, 9B and 11B are cross-sectional views taken along lines B-B' of FIGS. 4, 6, 8 and 10, respectively. FIGS. 9C and 11C are cross-sectional views taken along lines C-C' of FIGS. 8 and 10, respectively.

Figure 4:
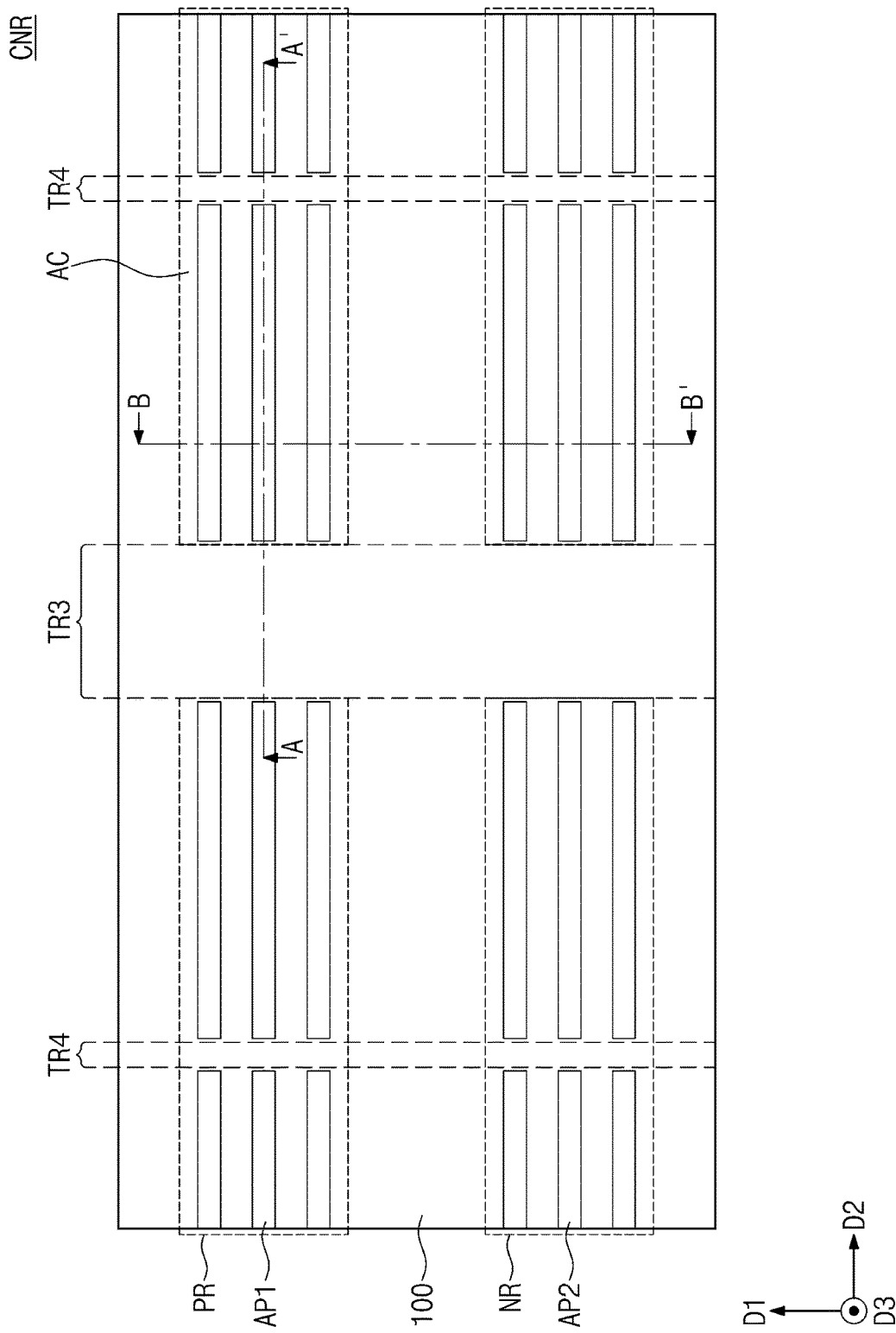
FIGS. 4, 6, 8 and 10 are plan views illustrating a method of manufacturing a semiconductor device according to some embodiments of the inventive concepts.
Figure 5A:
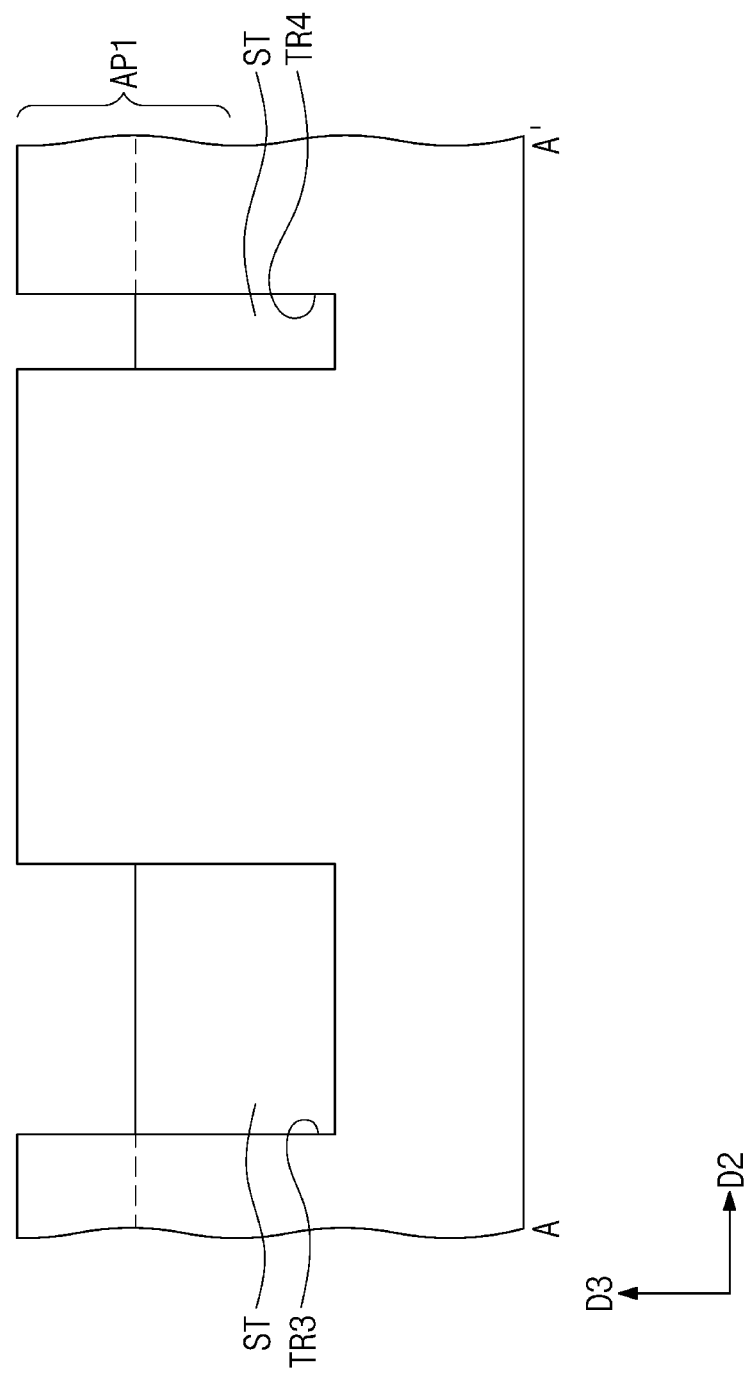
FIGS. 5A, 7A, 9A and 11A are cross-sectional views taken along lines A-A' of FIGS. 4, 6, 8 and 10, respectively.
Figure 5B:
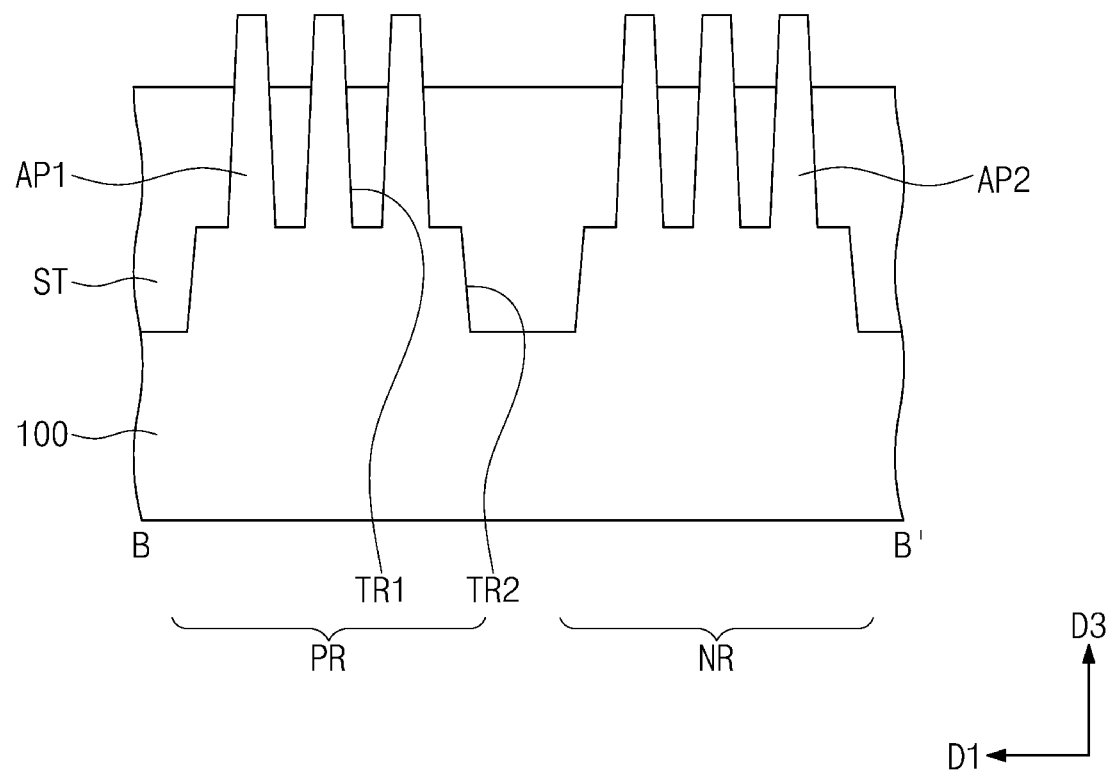
FIGS. 5B, 7B, 9B and 11B are cross-sectional views taken along lines B-B' of FIGS. 4, 6, 8 and 10, respectively.

Referring to FIGS. 4, 5A and 5B, a substrate 100 including a connection region CNR may be provided. For example, the connection region CNR may include a first active region PR and a second active region NR.

The substrate 100 may be patterned to form first and second active patterns AP1 and AP2. The first and second active patterns AP1 and AP2 may be formed on the connection region CNR. For example, the first active patterns AP1 may be formed on the first active region PR of the connection region CNR, and the second active patterns AP2 may be formed on the second active region NR of the connection region CNR.

First trenches TR1 may be formed between the first active patterns AP1 and between the second active patterns AP2. The first trenches TR1 may extend in the second direction D2 in parallel to the first and second active patterns AP1 and AP2. The substrate 100 may be patterned to form a second trench TR2 between the first active region PR and the second active region NR of the connection region CNR. The second trench TR2 may extend in the second direction D2. The second trench TR2 may be deeper than the first trench TR1.

The substrate 100 may be patterned to form a third trench TR3 and a fourth trench TR4, which intersect the first active patterns AP1 and the second active patterns AP2 in the first direction D1. The third trench TR3 and the fourth trench TR4 may extend in the first direction D1.

A device isolation layer ST may be formed on the substrate 100 to fill the first to fourth trenches TR1, TR2, TR3 and TR4. The device isolation layer ST may include or may be formed of an insulating material such as a silicon oxide layer. The device isolation layer ST may be recessed until upper portions of the first and second active patterns AP1 and AP2 are exposed. Thus, the upper portions of the first and second active patterns AP1 and AP2 may vertically protrude above the device isolation layer ST.

Figure 6:
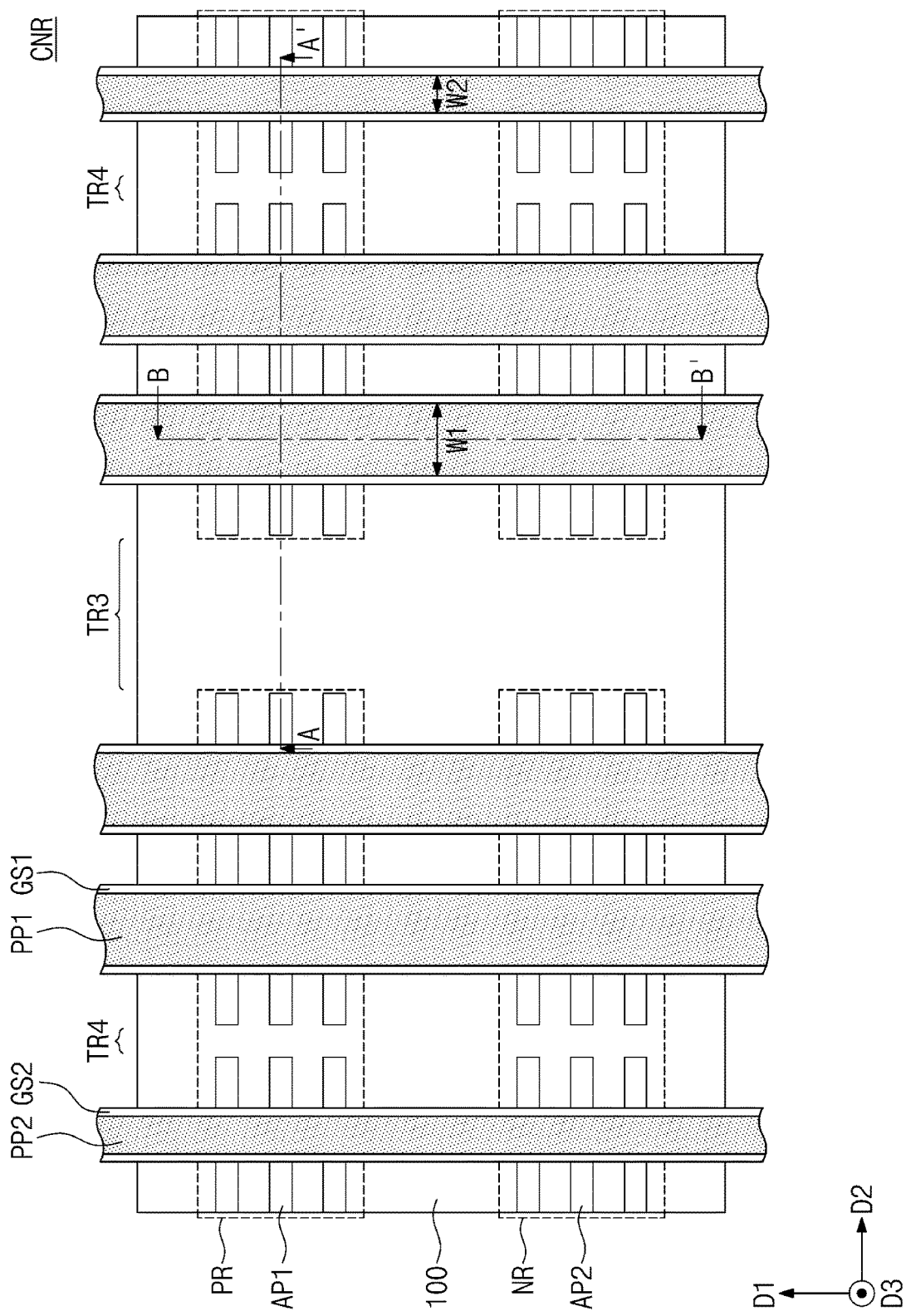
Figure 7A:
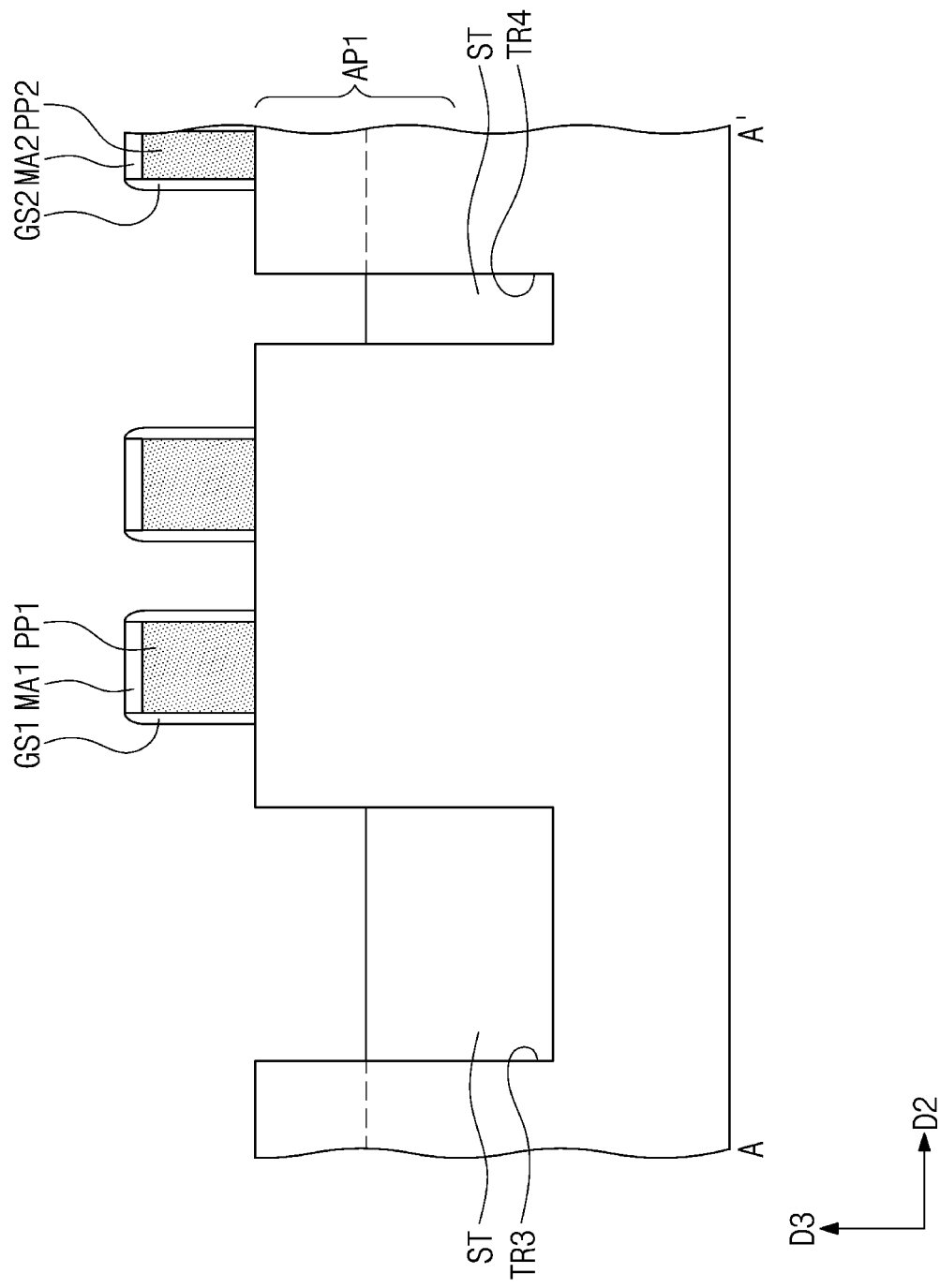
Figure 7B:
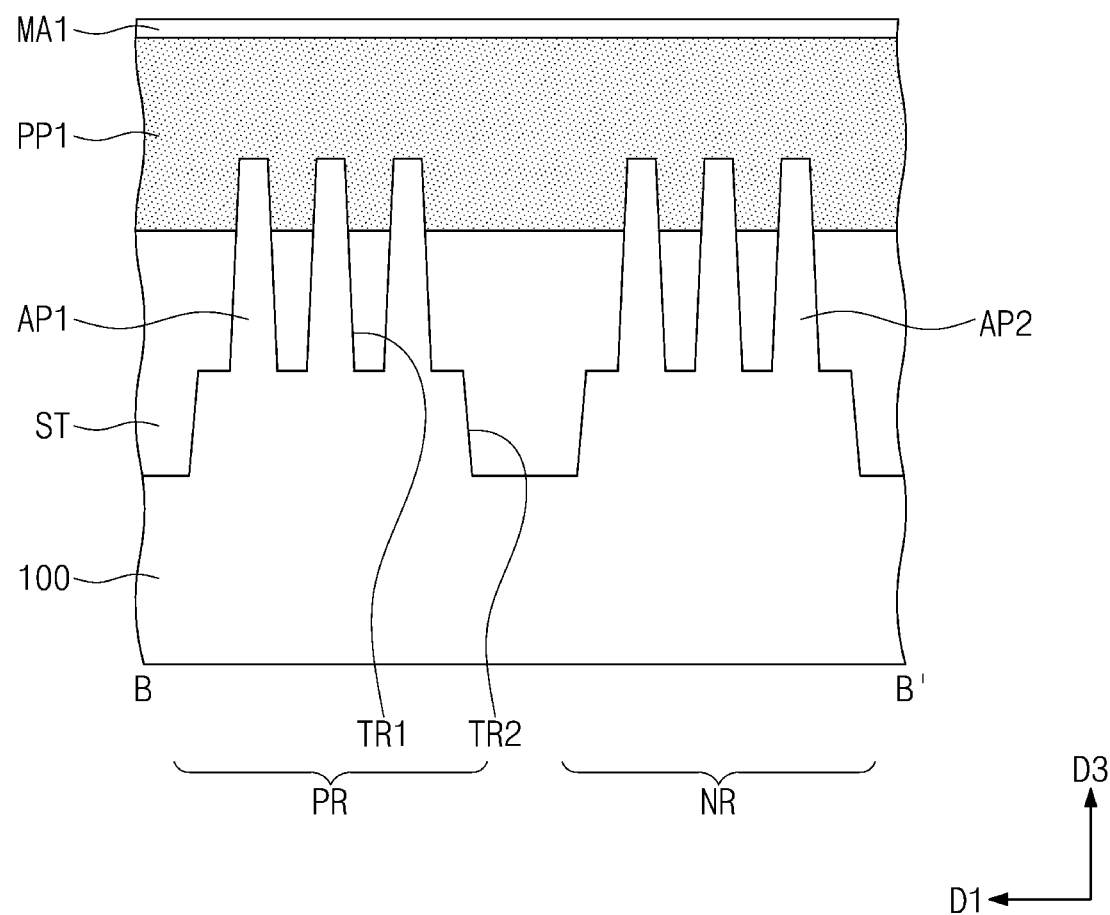
Figure 8:
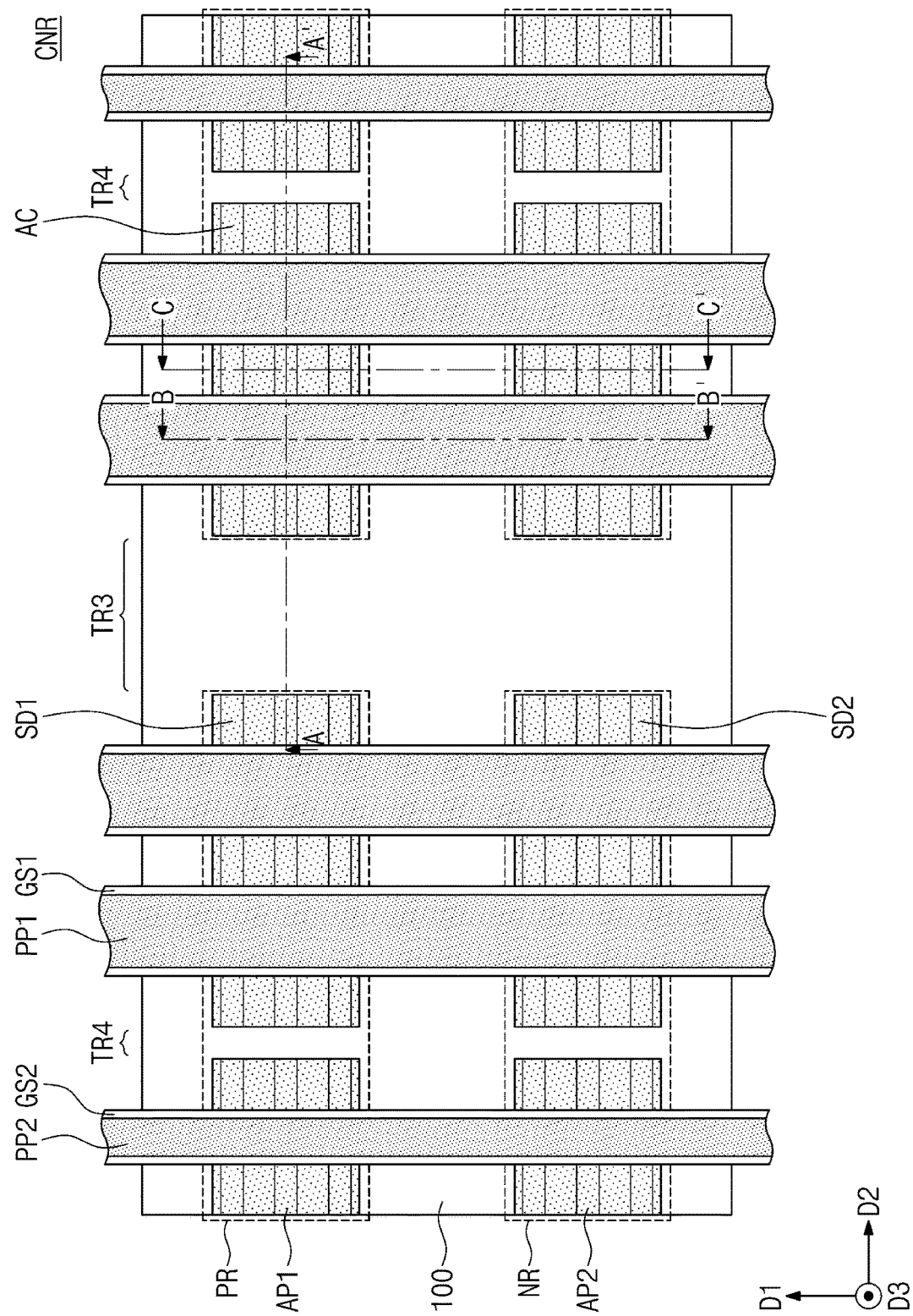

Referring to FIGS. 6, 7A and 7B, first and second sacrificial patterns PP1 and PP2 may be formed to intersect the first and second active patterns AP1 and AP2. Each of the first and second sacrificial patterns PP1 and PP2 may have a line or bar shape extending in the first direction D1. For example, the formation of the first and second sacrificial patterns PP1 and PP2 may include forming a sacrificial layer on an entire top surface of the substrate 100, forming first and second hard mask patterns MA1 and MA2 on the sacrificial layer, and patterning the sacrificial layer using the first and second hard mask patterns MA1 and MA2 as etch masks. The sacrificial layer may include or may be formed of poly-silicon.

A pair of electrode spacers GS1 may be formed on opposite sidewalls of the first sacrificial pattern PP1, respectively, and a pair of gate spacers GS2 may be formed on opposite sidewalls of the second sacrificial pattern PP2, respectively. The formation of the electrode spacers GS1 and the gate spacers GS2 may include conformally forming a spacer layer on an entire top surface of the substrate 100 and anisotropically etching the spacer layer. For example, the spacer layer may include or may be formed of at least one of SiCN, SiCON, and SiN. In certain embodiments, the spacer layer may be formed of a multi-layer including at least two of SiCN, SiCON, and SiN.

Referring to FIGS. 8 and 9A to 9C, first epi patterns SD1 may be formed in the upper portion of the first active pattern AP1. A pair of the first epi patterns SD1 may be formed at opposite sides of the first sacrificial pattern PP1, respectively, and a pair of the first epi patterns SD1 may be formed at opposite sides of the second sacrificial pattern PP2, respectively.

For example, the upper portion of the first active pattern AP1 may be etched using the first and second hard mask patterns MA1 and MA2, and the electrode spacers GS1 and the gate spacers GS2 as etch masks, thereby forming first recess regions RS1. The device isolation layer ST between the first active patterns AP1 may be recessed during the etching of the upper portion of the first active pattern AP1.

The first epi patterns SD1 may be formed by performing a selective epitaxial growth (SEG) process using inner surfaces of the first recess regions RS1 of the first active pattern AP1 as a seed layer.

For example, the SEG process may include a chemical vapor deposition (CVD) process or a molecular beam epitaxy (MBE) process. The first epi patterns SD1 may include a semiconductor material (e.g., SiGe) of which a lattice constant is greater than that of a semiconductor material of the substrate 100. In some embodiments, each of the first epi patterns SD1 may be formed of a plurality of stacked semiconductor layers.

In some embodiments, dopants may be injected in-situ into the first epi patterns SD1 during the SEG process for forming the first epi patterns SD1. In certain embodiments, the dopants may be injected or implanted into the first epi patterns SD1 after the SEG process for forming the first epi patterns SD1. The first epi patterns SD1 may be doped with the dopants to have a first conductivity type (e.g., a P-type).

Second epi patterns SD2 may be formed in the upper portion of the second active pattern AP2. A pair of the second epi patterns SD2 may be formed at opposite sides of each of the first and second sacrificial patterns PP1 and PP2, respectively.

For example, the upper portion of the second active pattern AP2 may be etched using the first and second hard mask patterns MA1 and MA2, and the electrode spacers GS1 and the gate spacers GS2 as etch masks, thereby forming second recess regions RS2 (see FIG. 9C). The second epi patterns SD2 may be formed by performing a SEG process using inner surfaces of the second recess regions RS2 of the second active pattern AP2 as a seed layer. For example, the second epi patterns SD2 may include the same semiconductor material (e.g., silicon) as the substrate 100. The second epi patterns SD2 may be doped with dopants to have a second conductivity type (e.g., an N-type).

The first epi patterns SD1 and the second epi patterns SD2 may be sequentially formed by different processes from each other. For example, the first epi patterns SD1 may not be formed simultaneously with the second epi patterns SD2.

The first and second epi patterns SD1 and SD2 may be formed on a logic cell region LCR and the connection region CNR by the same methods.

Referring to FIGS. 10 and 11A to 11C, a first interlayer insulating layer 110 may be formed to cover the first and second epi patterns SD1 and SD2, the first and second hard mask patterns MA1 and MA2, the electrode spacers GS1, and the gate spacers GS2. For example, the first interlayer insulating layer 110 may include or may be formed of a silicon oxide layer.

The first interlayer insulating layer 110 may be planarized to expose top surfaces of the first and second sacrificial patterns PP1 and PP2. The planarization process of the first interlayer insulating layer 110 may be performed using an etch-back process or a chemical mechanical polishing (CMP) process. The first and second hard mask patterns MA1 and MA2 may be completely removed during the planarization process. As a result, a top surface of the first interlayer insulating layer 110 may be substantially coplanar with the top surfaces of the first and second sacrificial patterns PP1 and PP2 and top surfaces of the electrode and gate spacers GS1 and GS2.

The first sacrificial patterns PP1 may be replaced with metal electrodes GE1, respectively. The second sacrificial patterns PP2 may be replaced with gate electrodes GE2, respectively. For example, the exposed first and second sacrificial patterns PP1 and PP2 may be selectively removed. Empty spaces may be formed by the removal of the first and second sacrificial patterns PP1 and PP2.

A first dielectric pattern GI1, the metal electrode GE1 and a first capping pattern GP1 may be formed in each of the empty spaces formed by the removal of the first sacrificial patterns PP1. The metal electrode GE1 may include a first metal pattern and a second metal pattern on the first metal pattern. The first metal pattern may be formed of a work function metal capable of adjusting a threshold voltage of a transistor, and the second metal pattern may be formed of a low-resistance metal. A second dielectric pattern GI2, the gate electrode GE2 and a second capping pattern GP2 may be formed in each of the empty spaces formed by the removal of the second sacrificial patterns PP2. Thus, a decoupling capacitor CAP and dummy transistors may be formed on the connection region CNR.

A second interlayer insulating layer 120 may be formed on the first interlayer insulating layer 110. The second interlayer insulating layer 120 may include or may be formed of a silicon oxide layer. Ground contacts AC may be formed in the second and first interlayer insulating layers 120 and 110. The ground contacts AC may penetrate the second and first interlayer insulating layers 120 and 110 so as to be electrically connected to the first and second epi patterns SD1 and SD2.

An electrode contact GC may be formed to penetrate the second interlayer insulating layer 120 and the first capping pattern GP1. The electrode contact GC may be electrically connected to the metal electrode GE1. Even though not shown in the drawings, an electrode contact penetrating the second interlayer insulating layer 120 and the second capping pattern GP2 so as to be connected to the gate electrode GE2 may be formed.

Referring again to FIGS. 2 and 3A to 3D, a third interlayer insulating layer 130 may be formed on the second interlayer insulating layer 120. Connection patterns CNP may be formed in the third interlayer insulating layer 130. The connection patterns CNP may be formed on the ground contacts AC and the electrode contact GC, respectively.

A fourth interlayer insulating layer 140 may be formed on the third interlayer insulating layer 130. An interconnection layer M1 may be formed in the fourth interlayer insulating layer 140. The formation of the interconnection layer M1 may include forming vias VI by a damascene process, and forming interconnection lines INL on the vias VI by a damascene process.

Before the formation of the fourth interlayer insulating layer 140 and the interconnection layer M1, at least one through-via TCT may be formed in the connection region CNR. The processes of forming the ground contacts AC, the electrode contact GC and the connection patterns CNP thereon may be a middle-of-line (MOL) process. The processes of forming the interconnection layer M1 and additional interconnection layers thereon may be a back-end-of-line (BEOL) process. The through-via TCT may be formed between the MOL process and the BEOL process.

FIGS. 12A to 12F are cross-sectional views illustrating a method of forming a through-via and an interconnection layer according to some embodiments of the inventive concepts. Hereinafter, the formation of the through-via TCT and the interconnection layer M1 will be described in detail with reference to FIGS. 12A to 12F.

Figure 12A:
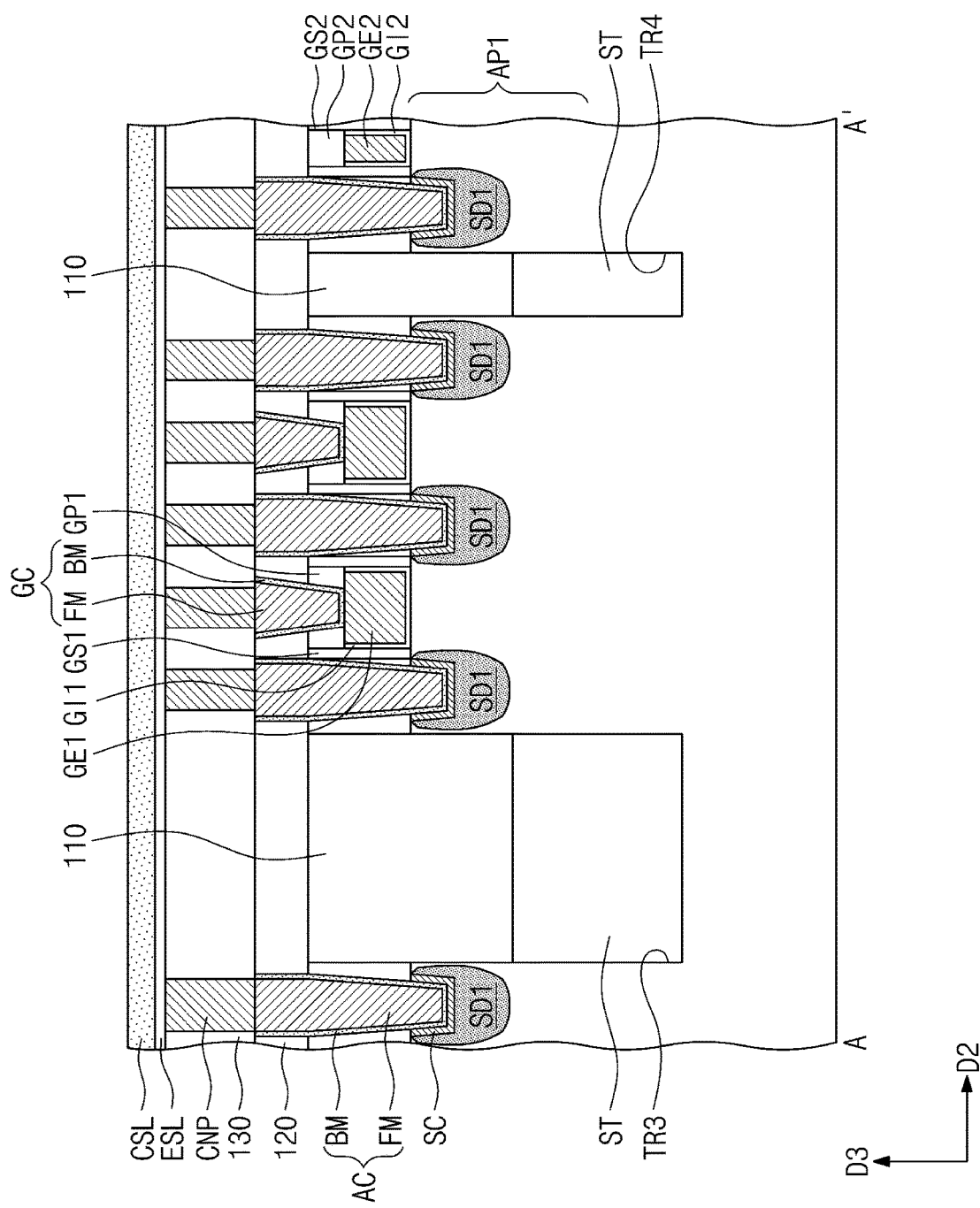
FIGS. 12A to 12F are cross-sectional views illustrating a method of forming a through-via according to some embodiments of the inventive concepts.

Referring to FIG. 12A, after the MOL process is completed, an etch stop layer ESL and a planarization stop layer CSL may be sequentially formed on the third interlayer insulating layer 130. The planarization stop layer CSL may function as a stop layer of a planarization process to be described later and may include or may be formed of at least one of SiN, SiCN, and SiON. The etch stop layer ESL may include or may be formed of a material having etch selectivity with respect to the planarization stop layer CSL. For example, the etch stop layer ESL may include or may be formed of a silicon oxide layer.

Figure 12B:
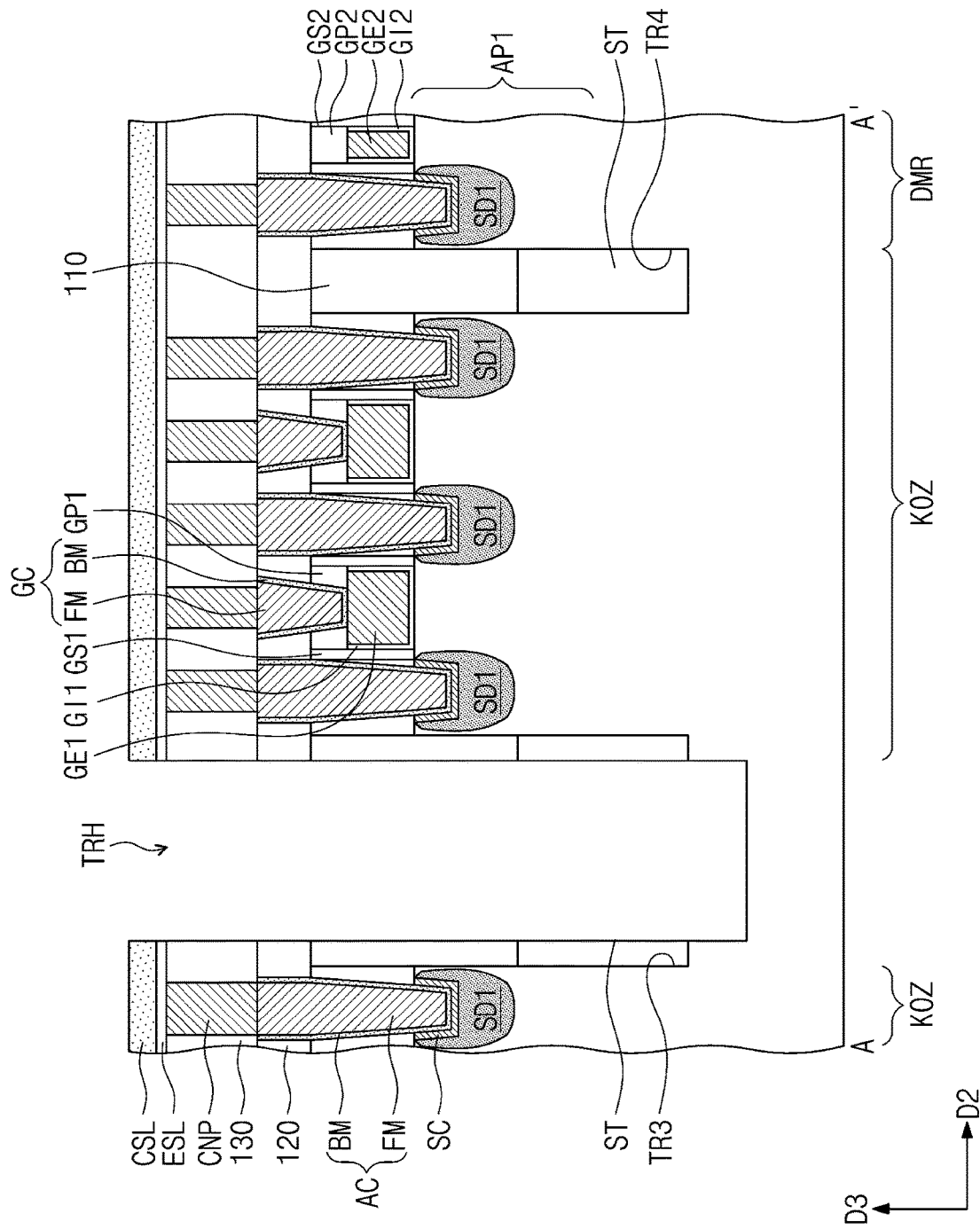

Referring to FIG. 12B, a through-hole TRH may be formed in the device isolation layer ST of the connection region CNR. For example, an anisotropic etching process may be performed on the planarization stop layer CSL to form the through-hole TRH penetrating the first to third interlayer insulating layers 110, 120 and 130 and the device isolation layer ST. The through-hole TRH may extend toward a bottom surface of the substrate 100 to penetrate an upper portion of the substrate 100. The through-hole TRH may not completely penetrate the substrate 100.

Figure 12C:
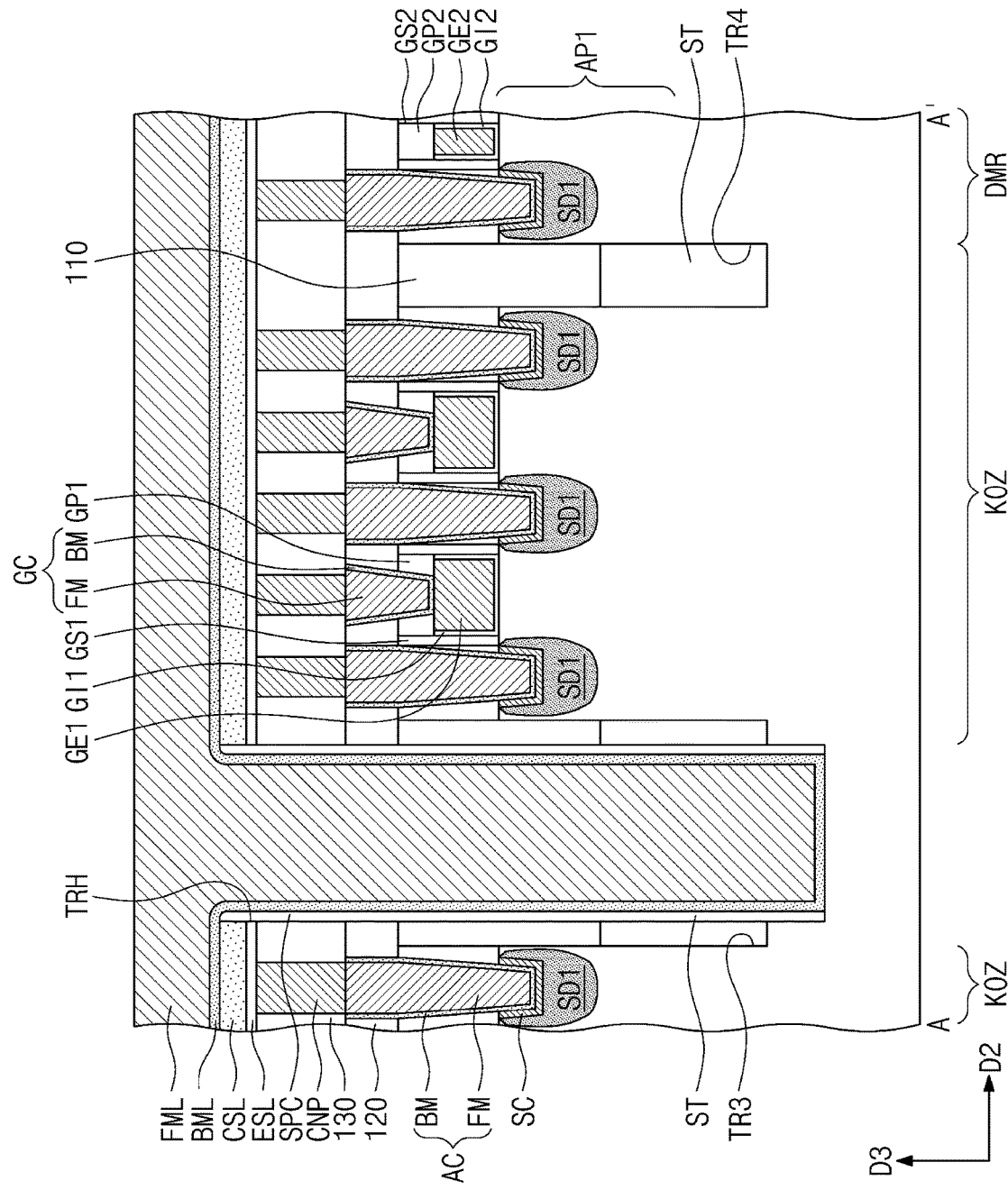

Referring to FIG. 12C, an insulating spacer SPC may be formed on an inner sidewall of the through-hole TRH. For example, the formation of the insulating spacer SPC may include conformally forming an insulating layer in the through-hole TRH, and anisotropically etching the insulating layer.

A barrier layer BML and a conductive layer FML may be sequentially formed to fill the through-hole TRH. The barrier layer BML may be conformally formed in the through-hole TRH. The barrier layer BML may include or may be formed of a metal nitride layer, or a metal layer/a metal nitride layer. The conductive layer FML may be formed to completely fill the through-hole TRH. The conductive layer FML may include or may be formed of a low-resistance metal (e.g., copper).

Figure 12D:
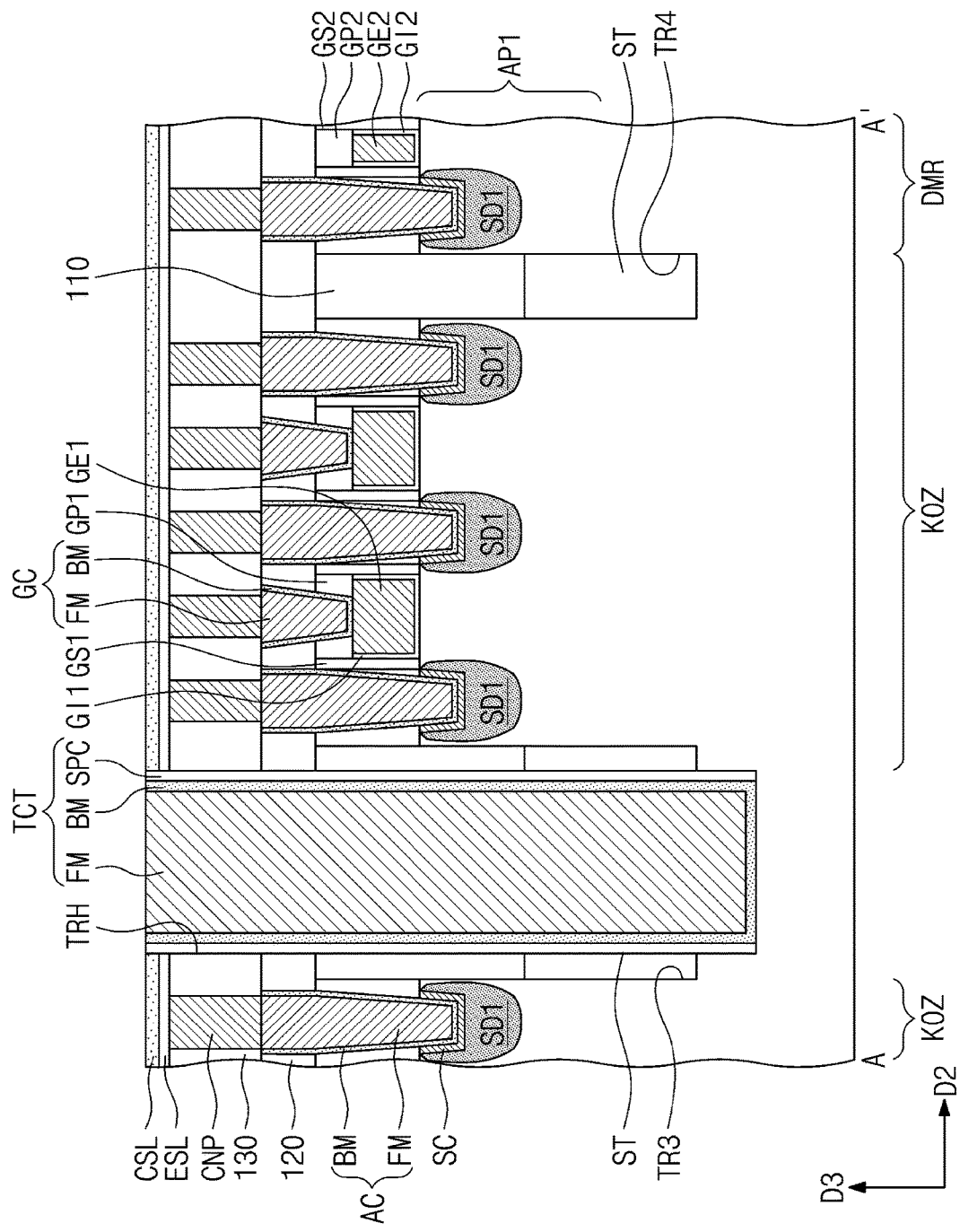

Referring to FIG. 12D, a planarization process may be performed on the conductive layer FML to form the through-via TCT. The planarization process may be performed to expose the planarization stop layer CSL. The barrier layer BML and the conductive layer FML on the planarization stop layer CSL may be completely removed by the planarization process.

The insulating spacer SPC, a barrier pattern BM and a conductive pattern FM may remain in the through-hole TRH. The insulating spacer SPC, the barrier pattern BM and the conductive pattern FM in the through-hole TRH may constitute the through-via TCT. A top surface of the insulating spacer SPC, a top surface of the barrier pattern BM, a top surface of the conductive pattern FM and a top surface of the planarization stop layer CSL may be substantially coplanar with each other by the planarization process.

Figure 12E:
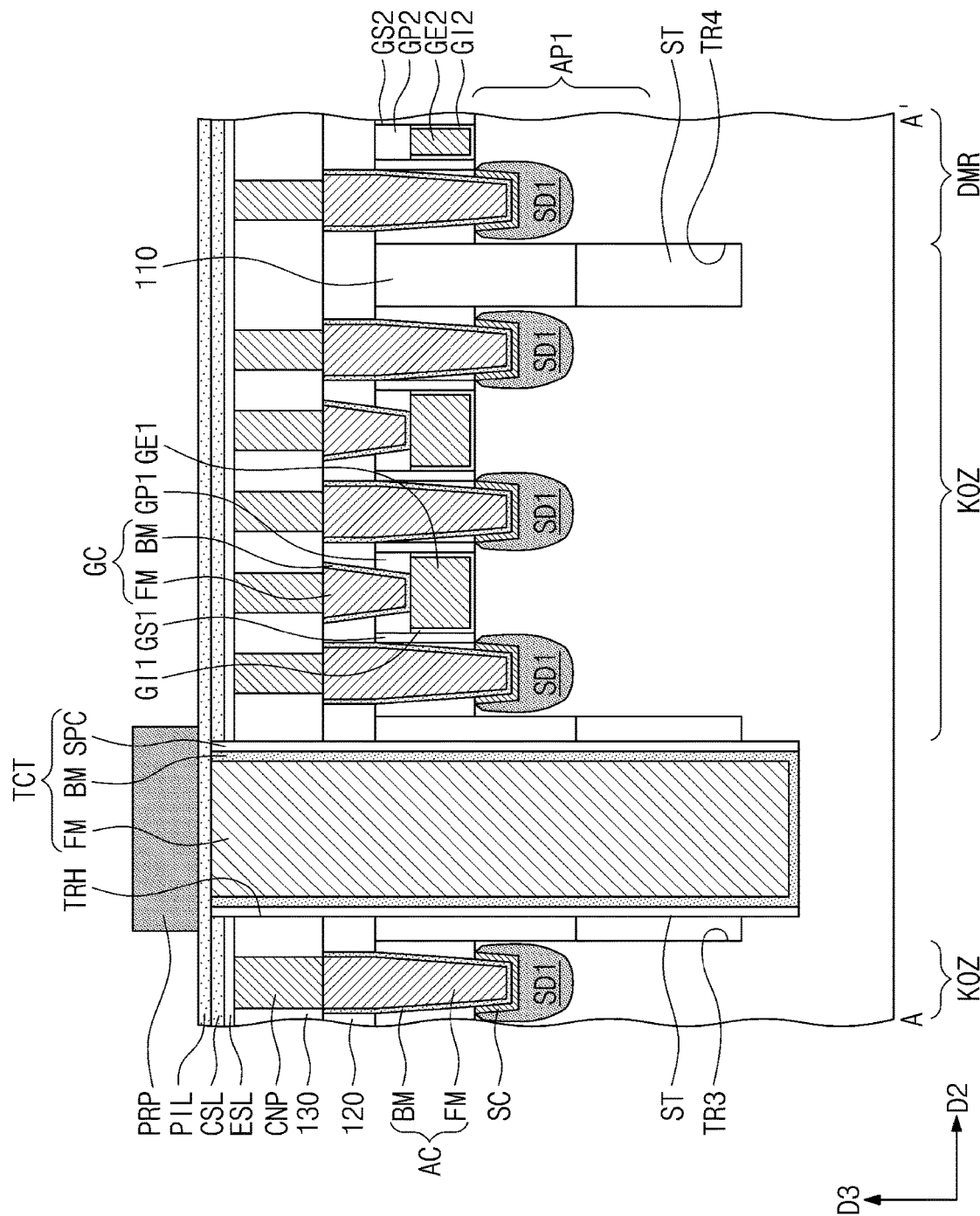

Referring to FIG. 12E, a protective insulating layer PIL may be formed on the planarization stop layer CSL and the through-via TCT. The protective insulating layer PIL may include or may be formed of at least one of SiN, SiCN, and SiON. For example, the protective insulating layer PIL may include or may be formed of the same material as the planarization stop layer CSL.

A photoresist pattern PRP may be formed to vertically overlap with the through-via TCT. The photoresist pattern PRP may selectively cover a portion of the protective insulating layer PIL provided on the through-via TCT and may expose another portion of the protective insulating layer PIL.

Figure 12F:
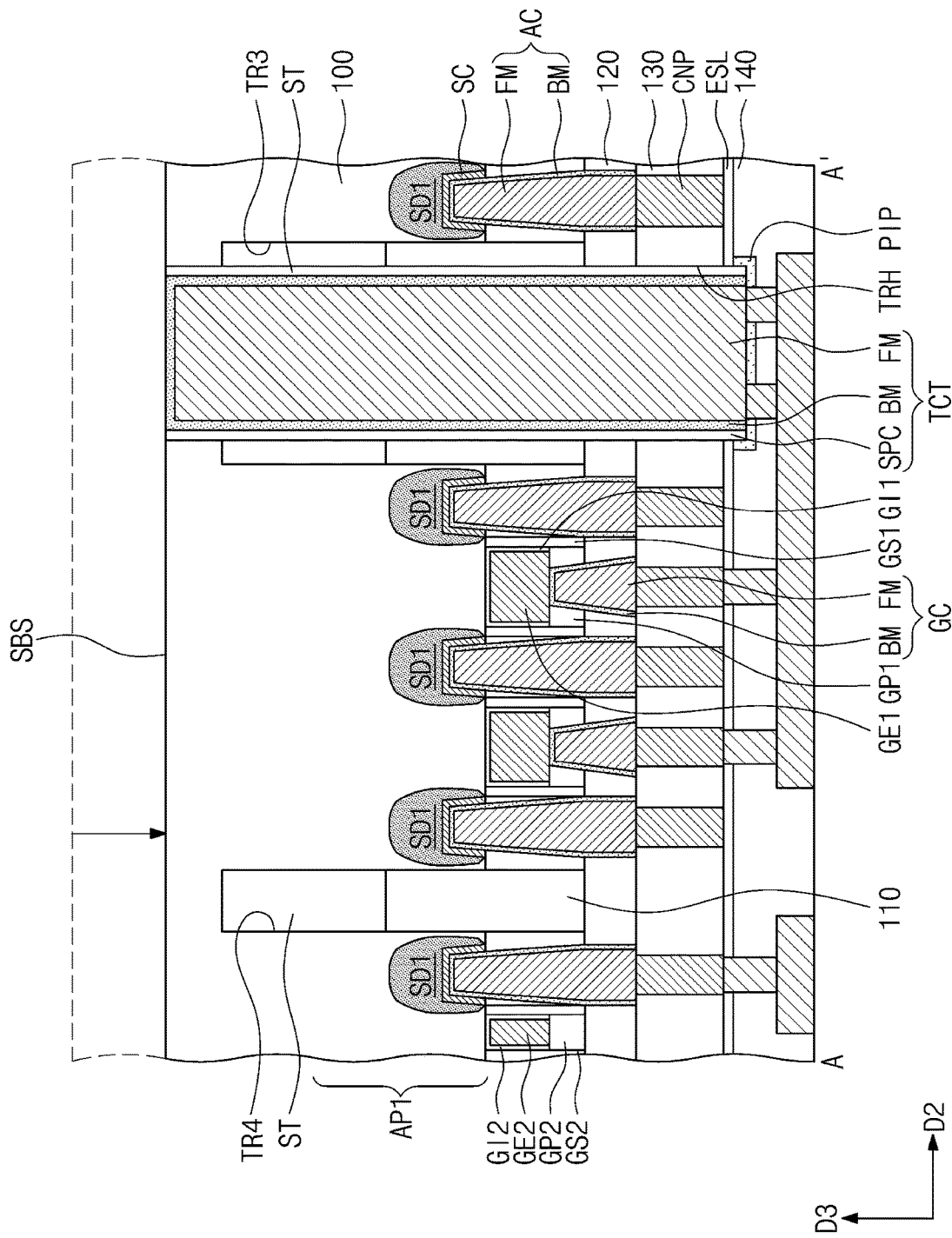

Referring to FIG. 12F, the protective insulating layer PIL and the planarization stop layer CSL may be etched using the photoresist pattern PRP as an etch mask. The etching process may be performed to expose the etch stop layer ESL. A portion of the protective insulating layer PIL and a portion of the planarization stop layer CSL, which are provided under the photoresist pattern PRP, may not be etched during the etching process. A remaining portion of the protective insulating layer PIL and a remaining portion of the planarization stop layer CSL may constitute a protective insulating pattern PIP. The protective insulating pattern PIP may cover a top surface TCTt of the through-via TCT and an upper sidewall TCTu of the through-via TCT. The protective insulating pattern PIP may protect or passivate an exposed portion of the through-via TCT.

Thereafter, the BEOL process may be performed on the etch stop layer ESL to form at least one interconnection layer M1. After the BEOL process is completed, the substrate 100 may be turned over, and a planarization process may be performed on a bottom surface of the substrate 100.

The substrate 100 may be thinned by a planarization process. The planarization process may be performed on the bottom surface of the substrate to expose the through-via TCT. By the planarization process, the conductive pattern FM of the through-via TCT may be exposed at the planarized bottom surface SBS of the substrate 100.

Thereafter, as illustrated in FIG. 3A, a passivation process may be performed on the planarized bottom surface SBS of the substrate 100 and the exposed through-via TCT to form a passivation layer PAV. A connection pad PAD may be formed on the exposed through-via TCT.

The semiconductor device according to the embodiments of the inventive concepts may include the metal-insulator-silicon (MIS) capacitor connected to the through-via (e.g., a through-silicon via (TSV)) in the keep-out zone. The MIS capacitor may correspond to the decoupling capacitor. The MIS capacitor may reduce an IR-drop caused by a connection resistance between the through-via and an integrated circuit. The MIS capacitor may be formed simultaneously with the dummy cell and the logic cell, and thus an additional process for forming the MIS capacitor may not be required.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a silicon substrate including a logic cell region and a connection region;
an active pattern provided at the connection region and protruding from a top surface of the connection region;
a device isolation layer covering a sidewall of a lower portion of the active pattern and exposing an upper portion of the active pattern;
a metal electrode overlapping the active pattern;
a dielectric pattern between the metal electrode and the active pattern;
an epitaxial pattern adjacent to a side of the metal electrode;
a middle connection layer on the metal electrode and the epitaxial pattern, the middle connection layer comprising:
a ground contact electrically connected to the epitaxial pattern; and
an electrode contact electrically connected to the metal electrode;
an interconnection layer on the middle connection layer, the interconnection layer comprising:
a plurality of interconnection lines; and
a plurality of vias electrically connecting the plurality of interconnection lines to the middle connection layer; and
a through-via provided under the interconnection layer and penetrating the connection region,
wherein the plurality of vias comprise a first via, a second via, and a third via,
wherein the first via is connected to the through-via,
wherein the second via is connected to the ground contact,
wherein the third via is connected to the electrode contact, and
wherein the first via and the third via are electrically connected with each other through a first interconnection line of the plurality of interconnection lines.

2. The semiconductor device of claim 1, further comprising:
a dummy transistor spaced apart from the through-via with the metal electrode interposed therebetween,
wherein the metal electrode extends in a first direction parallel to a top surface of the silicon substrate and has a first width in a second direction which is parallel to the top surface of the silicon substrate and intersects the first direction,
wherein the dummy transistor comprises:
a gate electrode; and
an epitaxial pattern provided at a side of the gate electrode,
wherein the gate electrode extends in the first direction and has a second width in the second direction, and
wherein the first width is greater than the second width.

3. The semiconductor device of claim 2,
wherein the device isolation layer fills a first trench and a second trench defining the active pattern,
wherein the through-via penetrates the device isolation layer in the first trench, and
wherein the metal electrode is spaced apart from the dummy transistor with the device isolation layer in the second trench interposed therebetween.

4. The semiconductor device of claim 1,
wherein the epitaxial pattern includes a semiconductor element having a lattice constant greater than that of the silicon substrate.

5. The semiconductor device of claim 1,
wherein the through-via comprises:
a conductive pattern having a pillar shape;
a barrier pattern surrounding an outer sidewall of the conductive pattern; and
an insulating spacer surrounding an outer sidewall of the barrier pattern.

* * * * *